(12) United States Patent
Sporck et al.

(10) Patent No.: US 11,784,499 B2
(45) Date of Patent: Oct. 10, 2023

(54) MULTI-PORT BATTERY CHARGE AND DISCHARGE SYSTEM

(71) Applicant: Monolithic Power Systems, Inc., San Jose, CA (US)

(72) Inventors: Christian Sporck, Campbell, CA (US); Min Xu, Hangzhou (CN); Rui Wang, Chengdu (CN)

(73) Assignee: Monolithic Power Systems, San Jose, CA (US)

( * ) Notice: Subject to any disclaimer, the term of this patent is extended or adjusted under 35 U.S.C. 154(b) by 246 days.

(21) Appl. No.: 17/233,291

(22) Filed: Apr. 16, 2021

(65) Prior Publication Data

US 2022/0337069 A1 Oct. 20, 2022

(51) Int. Cl.
*H02J 7/00* (2006.01)
*H02M 1/00* (2006.01)
*G06F 1/26* (2006.01)
*G01R 19/165* (2006.01)
*H02M 3/158* (2006.01)

(52) U.S. Cl.
CPC ...... *H02J 7/0024* (2013.01); *G01R 19/16538* (2013.01); *G06F 1/266* (2013.01); *H02J 7/007* (2013.01); *H02J 7/0045* (2013.01); *H02J 7/0048* (2020.01); *H02J 7/0063* (2013.01); *H02M 1/0003* (2021.05); *H02M 3/158* (2013.01)

(58) Field of Classification Search
CPC ............................ H02J 7/0024; H02J 7/0048
See application file for complete search history.

(56) References Cited

U.S. PATENT DOCUMENTS

2021/0036533 A1\* 2/2021 Sporck ................. H02J 7/0071

\* cited by examiner

*Primary Examiner* — Robert Grant
(74) *Attorney, Agent, or Firm* — Perkins Coie LLP

(57) ABSTRACT

A multi-port battery charge and discharge system used for battery pack charge and discharge. The multi-port battery charge and discharge system has a plurality of voltage converting circuits, each of which can operate in a charge mode to supply load and charge a battery pack or in a discharge mode to supply power sinks. The multi-port battery charge and discharge system further has at least one switch module providing an additional current signal to charge the battery pack.

20 Claims, 11 Drawing Sheets

MULTI-PORT BATTERY CHARGE AND DISCHARGE SYSTEM

TECHNICAL FIELD

The present invention relates to electrical circuit, more particularly but not exclusively relates to multi-port battery charge and discharge systems.

BACKGROUND

With the rapid development of portable electronic devices, such as tablets, phablets, laptops, thin computing devices, power bank, etc., battery charge and discharge circuit is widely used in various portable electronic devices. As the entertainment function of the portable electronic devices expands, battery capacity becomes larger and larger to ensure enough navigation time. In consequence, portable electronic device manufacturers desire to seek solutions to charge their batteries much faster than before.

Generally, the portable electronic devices may be charged via a Universal Serial Bus (USB) port. However, usually, the charge current is limited based on the existed standard USB charge Specification. For example, the maximum charge current which can be drawn from an AC power source via a USB port to charge the portable electronic device is limited to 5 A in accordance with the standard USB type-C Specification. And in some application, good thermal dissipation also needs to be considered. Therefore, it is desired to have a solution with good thermal dissipation for realizing faster charge to the portable electronic devices by a larger current.

SUMMARY

In accomplishing the above and other objects, there has been provided, in accordance with an embodiment of the present invention, a multi-port battery charge and discharge system comprising: a plurality of voltage converting circuits, wherein each one of the plurality of voltage converting circuits comprises a first pin configured to receive an input voltage signal, and a second pin configured to provide an system voltage signal, and wherein one of the plurality of voltage converting circuits is configured to be as a master circuit, and wherein the master circuit is configured to operate in a charge mode to generate a master current signal at its second pin; a first switch module, wherein an input terminal of the first switch module is coupled to the first pin of the master circuit, and wherein an output terminal of the first switch module is coupled to the second pin of the master circuit; and wherein when the input voltage signal is larger than the system voltage signal, the master circuit is configured to control the first switch module to generate a first additional current signal at the output terminal of the first switch module.

In accordance with an embodiment of the present invention, a multi-port battery charge and discharge system comprising: a first voltage converting circuit, having a first pin and a second pin, wherein the first voltage converting circuit is configured to operate in a charge mode to generate a master current signal and an system voltage signal at its second pin; a second voltage converting circuit, having a first pin and a second pin coupled to the second pin of the first voltage converting circuit, wherein the second voltage converting circuit is configured to operate in a discharge mode; a first switch module, wherein an input terminal of the first switch module is coupled to the first pin of the first voltage converting circuit to receive an input voltage signal, an output terminal of the first switch module is coupled to the second pin of the first voltage converting circuit; and wherein when the first switch module is enabled and the input voltage signal is larger than the system voltage signal, the first voltage converting circuit is configured to control the first switch module to generate a first additional current signal at its second pin.

BRIEF DESCRIPTION OF THE DRAWINGS

Non-limiting and non-exhaustive embodiments are described with reference to the following drawings.

The use of the same reference label in different drawings indicates the same or like components.

DETAILED DESCRIPTION

In the present application, numerous specific details are provided, such as examples of circuits, components, and methods, to provide a thorough understanding of embodiments of the invention. These embodiments are exemplary, not to confine the scope of the invention. Persons of ordinary skill in the art will recognize, however, that the invention can be practiced without one or more of the specific details. In other instances, well-known details are not shown or described to avoid obscuring aspects of the invention. Some phrases are used in some exemplary embodiments. However, the usage of these phrases is not confined to these embodiments.

Several embodiments of the present invention are described below with reference to battery charge and discharge circuit and associated control circuit.

Figure 1:
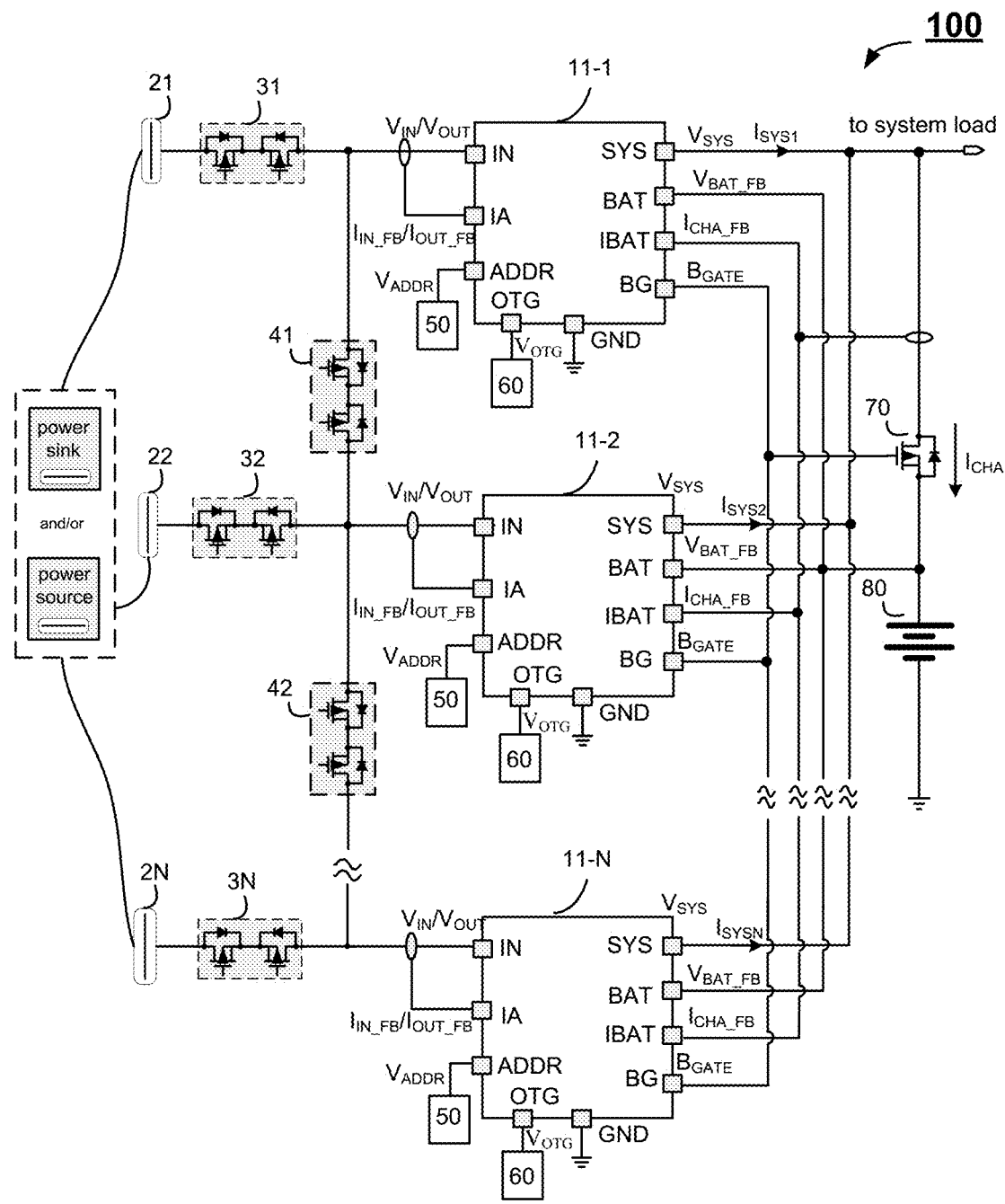
FIG. 1 schematically illustrates a multi-port battery charge and discharge system 100 in accordance with an embodiment of the present invention.

FIG. 1 schematically illustrates a multi-port battery charge and discharge system 100 in accordance with an embodiment of the present invention. In the embodiment shown in FIG. 1, the multi-port battery charge and discharge system 100 may comprise N voltage converting circuits (11-1, 11-2, ..., 11-N), wherein N is an integer greater than or equal to 2. One of ordinary skill in the art would understand that the value of N can be flexibly chosen depending on design specifications without departing from the scope of the present disclosure. In the exemplary embodiment of FIG. 1, the N voltage converting circuits (11-1, 11-2, ..., 11-N) are identical circuits having the same schematic structures and functions. In the exemplary embodiment of FIG. 1, each one of the N voltage converting circuits (11-1, 11-2, ..., 11-N) may comprise a plurality of pins, including but not limited to a mode pin OTG, a port connecting pin IN, a current feedback pin IA, an address pin ADDR, a system pin SYS, a battery voltage pin BAT, a battery current pin IBAT, a driving pin BG, and a ground pin GND. It should be appreciated that each one of the N voltage converting circuits (11-1, 11-2, ..., 11-N) may comprise as many pins as needed or desired according to various practical application requirements.

In the exemplary embodiment of FIG. 1, the multi-port battery charge and discharge system 100 may further comprise N USB ports (21, 22, ..., 2N) corresponding to the N voltage converting circuits (11-1, 11-2, ..., 11-N), a plurality of port connecting switches (31, 32, ..., 3N), a plurality of pin connecting switches (41, 42, ..., 4(N−1)), an external selection indicator 50, a mode selection indicator 60, a battery switch 70 and a battery pack 80. The battery pack 80 may comprise any known configuration of one or more battery cells (e.g., a single-cell configuration, a multi-cell configuration, a multi-stack configuration, etc.) and may use any suitable chemistry that allows for recharging.

In the exemplary embodiment of FIG. 1, the multi-port battery charge and discharge system 100 may be configured to operate in a charge state, a discharge state and a charge and discharge state. And each one of the N voltage converting circuits (11-1, 11-2, ..., 11-N) may be configured to operate in a charge mode or a discharge mode. For example, when the multi-port battery charge and discharge system 100 operates in the charge state, each one of the N voltage converting circuits (11-1, 11-2, ..., 11-N) may operate in the charge mode; when the multi-port battery charge and discharge system 100 operates in the discharge state, each one of the N voltage converting circuits (11-1, 11-2, ..., 11-N) may operate in the discharge mode; when the multi-port battery charge and discharge system 100 operates in the charge and discharge state, a first portion of the N voltage converting circuits (11-1, 11-2, ..., 11-N) may operate in the charge mode, and a second portion (e.g. the remained portion except the first portion) of the N voltage converting circuits (11-1, 11-2, ..., 11-N) may operate in the discharge mode. But one of ordinary skill in the art should understand that the second portion does not necessarily be the whole remained portion except the first portion of the N voltage converting circuits (11-1, 11-2, ..., 11-N), for example, there may be a third portion (different from the first portion and the second portion) of the N voltage converting circuits staying idle (voltage converting circuits in the third portion may not be operating, neither in the charge mode nor in the discharge mode).

In the exemplary embodiment of FIG. 1, for each i=1, 2, ..., N, the mode pin OTG of the voltage converting circuit 11-$i$ may be coupled to the mode selection indicator 60 to receive an OTG signal $V_{OTG}$. The OTG signal $V_{OTG}$ may be used to configure the voltage converting circuit 11-$i$ to operate in the charge mode or in the discharge mode. In some embodiments, the mode selection indicator 60 may be a source of a suitable digital signal that can serve to instruct the voltage converting circuit 11-$i$ whether to operate in the charge mode or in the discharge mode. In such an application, the OTG signal $V_{OTG}$ is a logic signal having a high logic state and a low logic state. For example, when the OTG signal $V_{OTG}$ is at the high logic state, the voltage converting circuit 11-$i$ may be configured to operate in the charge mode, when the OTG signal $V_{OTG}$ is at the low logic state, the voltage converting circuit 11-$i$ may be configured to operate in the discharge mode. In other embodiments, the mode selection indicator 60 may be a source of a suitable analog signal, or a resistive element. For example, a connection to ground potential (i.e., resistance of the resistive element is 0Ω) may serve to instruct the voltage converting circuit 11-$i$ should operate in the charge mode while a non-zero resistance value of the resistive element (e.g., 10 KΩ, 20 KΩ, etc.) may serve to instruct the voltage converting circuit 11-$i$ should operate in the discharge mode. In an embodiment, the mode selection indicator 60 may be part of an external controller, such as a micro programmed control unit (MCU), a single chip microcomputer (SCM), or an embedded controller (EC), etc. That is to say, the external controller may be configured to provide the OTG signal $V_{OTG}$ to the OTG pin of the voltage converting circuit 11-$i$ to instruct the voltage converting circuit 11-$i$ to operate in the charge mode or in the discharge mode.

For each i=1, 2, ..., N, the port connecting pin IN of the voltage converting circuit 11-$i$ may be coupled to a corresponding one USB port 2$i$ through a corresponding one port connecting switch 3$i$, for example, the port connecting pin IN of the first voltage converting circuit 11-1 is coupled to the first USB port 21 through the first port connecting switch 31, the port connecting pin IN of the second voltage converting circuit 11-2 is coupled to the second USB port 22 through the second port connecting switch 32, and the port connecting pin IN of the N$^{th}$ voltage converting circuit 11-N is coupled to the N$^{th}$ USB port 2N through the N$^{th}$ port connecting switch 3N, and so forth.

In the exemplary embodiment of FIG. 1, the port connecting pins IN of every two successively neighboring voltage converting circuits of the N voltage converting circuits (11-1, 11-2, ..., 11-N) are coupled through one of the plurality of pin connecting switches (41, 42, ..., 4(N−1)). For example, the port connecting pin IN of the first voltage converting circuit 11-1 is connected to the port connecting pin IN of the second voltage converting circuit 11-2 through the first pin connecting switch 41, the port connecting pin IN of the second voltage converting circuit 11-2 is connected to the port connecting pin IN of the third voltage converting circuit 11-3 through the second pin connecting switch 42, and so forth. When the voltage converting circuit 11-$i$ (i=1, ..., N) operates in the charge mode, the port connecting pin IN of the voltage converting circuit 11-$i$ (i=1, ..., N) may be configured to receive an input voltage signal $V_{IN}$ from an external power source through the corresponding one USB port 2$i$. When the voltage converting circuit 11-$i$ (i=1, ..., N) operates in the discharge mode, e.g., a USB on-the-go (OTG) mode, the port connecting pin IN of the voltage converting circuit 11-$i$ (i=1, ..., N) may be configured to provide an output voltage signal $V_{OUT}$ to an external power sink through the corresponding one USB port 2$i$.

For each i=1, 2, ..., N, the current feedback pin IA of the voltage converting circuit 11-$i$ may be coupled to a common connection of the corresponding port connecting switch 3*i* and the port connecting pin IN of the voltage converting circuit 11-*i* to receive a current feedback signal. When the voltage converting circuit 11-*i* operates in the charge mode, the current feedback pin IA of the voltage converting circuit 11-*i* may be configured to receive an input current feedback signal $I_{IN\_FB}$ indicative of a current flowing into the port connecting pin IN of the voltage converting circuit 11-*i* from the corresponding USB port 2*i*. When the voltage converting circuit 11-*i* operates in the discharge mode, the current feedback pin IA of the voltage converting circuit 11-*i* may be configured to receive an output current feedback signal $I_{OUT\_FB}$ indicative of a current flowing out the port connecting pin IN of the voltage converting circuit 11-*i* to the corresponding USB port 2*i*.

For each i=1, 2, . . . , N, the address pin ADDR of a corresponding one (e.g. the voltage converting circuit 11-*i*) of the N voltage converting circuits (11-1, 11-2, . . . , 11-N) may be configured to instruct the corresponding one voltage converting circuit 11-*i* whether to operate in a single circuit application or in a multiple circuits application. In the exemplary embodiment of FIG. 1, for each i=1, 2, . . . , N, the address pin ADDR of the corresponding one voltage converting circuit 11-*i* may be configured to connect to the external selection indicator 50 to receive a corresponding one address signal $V_{ADDR}$ to configure the corresponding one voltage converting circuit 11-*i* to operate in the single circuit application or in the multiple circuits application. The selection indicator 50 is "external" in the sense that it is not part of the corresponding one voltage converting circuit 11-*i*. In some embodiments, the external selection indicator 50 may comprise a resistive element, and a voltage across the resistive element may serve to indicate the corresponding one address signal $V_{ADDR}$. For example, a connection to ground potential (i.e., resistance of the resistive element is 0Ω) may serve to indicate the corresponding one voltage converting circuit 11-*i* should operate in the single circuit application while a non-zero resistance value of the resistive element (e.g., 10 KΩ, 20 KΩ, etc.) may serve to instruct the corresponding one voltage converting circuit 11-*i* should operate in the multiple circuits application. During the multiple circuits application, for each i=1, 2, . . . , N, the voltage converting circuit 11-*i* may be configured to operate in a "master" mode or in a "slave" mode through setting the resistive element to different resistance values. The address pin ADDR of the corresponding one voltage converting circuit 11-*i* may further be configured to program an address for the corresponding one voltage converting circuit 11-*i* through setting the resistive element to different resistance values at the address pin ADDR. For example, at the initialization during startup, each one of the N voltage converting circuits (11-1, 11-2, . . . , 11-N) may detect the corresponding one address signal $V_{ADDR}$ at its address pin ADDR to determine whether the corresponding one voltage converting circuit 11-*i* (i=1, . . . , N) should operate in the "master" mode or in the "slave" mode. In an embodiment, the voltage converting circuit which receives the corresponding one address signal $V_{ADDR}$ having the highest magnitude among the N address signals provided to the N voltage converting circuits (11-1, 11-2, . . . , 11-N) may be selected as a master voltage converting circuit and operate in the "master" mode, while the remained (N−1) voltage converting circuits may serve as the slave circuits and operate in the "slave" mode. In an embodiment, the voltage converting circuit with the resistive element having the highest resistance value connected to its address pin ADDR may be selected as a master voltage converting circuit and operate in the "master" mode, while the remained (N−1) voltage converting circuits may serve as the slave circuits and operate in the "slave" mode. In an alternative embodiment, only one of the N address signals $V_{ADDR}$ provided to the N voltage converting circuits (11-1, 11-2, . . . , 11-N) may be different from the rest of (N−1) address signals (i.e. the rest of (N−1) address signals are the same). For this situation, only one of the N voltage converting circuits (11-1, 11-2, . . . , 11-N), which one is configured to receive the one different address signal $V_{ADDR}$, may serve as the master voltage converting circuit and operates in the "master" mode, while the remained (N−1) voltage converting circuits which respectively receive the rest of (N−1) same address signals $V_{ADDR}$ may serve as the slave circuits and operate in the "slave" mode. In an alternative embodiment, wherein the N voltage converting circuits (11-1, 11-2, . . . , 11-N) are respectively coupled to N resistive elements, only one of the N resistive elements may have a different resistance value from the remained (N−1) resistive elements (i.e. the remained (N−1) resistive elements are of a same resistance value), and the voltage converting circuit which is coupled to the resistive element having the different resistance value may serve as the master voltage converting circuit and operates in the "master" mode, while the remained (N−1) voltage converting circuits may serve as the slave circuits and operate in the "slave" mode. In still other alternative embodiments, the external selection indicator 50 may be a source of a suitable analog signal or a digital signal that can serve to instruct the corresponding voltage converting circuit whether to operate in the "master" mode or in the "slave" mode.

The system pin SYS of each one of the N voltage converting circuits (11-1, 11-2, . . . , 11-N) may be connected to the system load and may be configured to provide a system voltage signal $V_{SYS}$. The system pin SYS of each one of the N voltage converting circuits (11-1, 11-2, . . . , 11-N) may further be connected to a battery pack 80 e.g. through the battery switch 70.

The battery voltage pins BAT of the N voltage converting circuits (11-1, 11-2, . . . , 11-N) may be connected together to receive a battery voltage feedback signal $V_{BAT\_FB}$ which is indicative of the voltage of the battery pack 80.

The battery current pins IBAT of the N voltage converting circuits (11-1, 11-2, . . . , 11-N) may be connected together to receive a battery current feedback signal $I_{CHA\_FB}$ which is indicative of the current flowing through the battery pack 80.

The driving pin BG of each one of the N voltage converting circuits (11-1, 11-2, . . . , 11-N) may be connected to a control terminal of the battery switch 70. In an embodiment, only one of the N voltage converting circuits (11-1, 11-2, . . . , 11-N) is configured to provide a driving signal $B_{GATE}$ to drive the battery switch 70, and the driving pins BG of the remained (N−1) voltage converting circuits are disabled. For example, in the master-slave circuits application, only the master voltage converting circuit can be configured to provide the driving signal $B_{GATE}$ to drive the battery switch 70, and the driving pins BG of the slave circuits may be disabled. It should be understood, in other embodiments, instead of positioning the battery switch 70 outside the N voltage converting circuits (11-1, 11-2, . . . , 11-N), the battery switch 70 could be positioned into the N voltage converting circuits (11-1, 11-2, . . . , 11-N). In such an application, each of the N voltage converting circuits (11-1, 11-2, . . . , 11-N) comprises one battery switch and a pin directly connected to the battery pack 80 while the driving pin BG could be omitted.

The ground pin GND of each one of the N voltage converting circuits (11-1, 11-2, ..., 11-N) may be connected to the logic ground.

In the following, the operation process of the multi-port battery charge and discharge system 100 will be described in detail when it respectively operates in the charge state, the discharge state and the charge and discharge state.

In the charge state, the multi-port battery charge and discharge system 100 may be configured to supply the system load and charge the battery pack 80. The port connecting pin IN of each of the N voltage converting circuits (11-1, 11-2, ..., 11-N) may be configured to receive the input voltage signal $V_{IN}$, and to convert the input voltage signal $V_{IN}$ to the system voltage signal $V_{SYS}$ that is provided at the system pin SYS. In such an application, the multi-port battery charge and discharge system 100 may be configured to have three charging ways (configurations), i.e., a multi-source fast charging way, a multi-port fast charging way, and a parallel charging way, to supply the system load and charge the battery pack 80.

In the multi-source fast charging way, for each i=1, 2, ..., N, the USB port 2i of the multi-port battery charge and discharge system 100 may be connected to a corresponding one power source to draw the input voltage signal $V_{IN}$ to supply the port connecting pin IN of the corresponding one voltage converting circuit 11-i. Meanwhile, all of the plurality of port connecting switches (31, 32, ..., 3N) are turned on while all of the plurality of pin connecting switches (41, 42, ..., 4N-1) are turned off. Thus, the port connecting pin IN of each voltage converting circuit 11-i (i=1, 2, ..., N) may receive the input voltage signal $V_{IN}$ from the corresponding one USB port 2i (i=1, 2, ..., N). In such an application, the multi-port battery charge and discharge system 100 may charge the battery pack 80 from the N USB ports (21, 22, ..., 2N) simultaneously. In an embodiment, the power sources connected to the N USB ports (21, 22, ..., 2N) may have different independent voltage levels, e.g., one power source may provide a voltage of 5V, and another power source may provide a voltage of 20V, and so on. In other embodiment, the power sources connected to the N USB ports (21, 22, ..., 2N) may have the same voltage levels, e.g., all the power sources may provide a voltage of 5V.

In the multi-port fast charging way, the N USB ports (21, 22, ..., 2N) of the multi-port battery charge and discharge system 100 may be connected to a same power source to draw the input voltage signal $V_{IN}$ to the port connecting pins IN of the corresponding N voltage converting circuits (11-1, 11-2, ..., 11-N). Meanwhile, all of the plurality of port connecting switches (31, 32, ..., 3N) are turned on while all of the plurality of pin connecting switches (41, 42, ..., 4N-1) are turned off. Thus, the port connecting pin IN of each voltage converting circuit 11-i (i=1, 2, ..., N) may receive the input voltage signal $V_{IN}$ from the corresponding one USB port 2i (i=1, 2, ..., N). In an embodiment, the power source in the multi-port fast charging way may comprise N USB ports, and N USB cables may be used to connect the N USB ports of the power source to the N USB ports (21, 22, ..., 2N) of the multi-port battery charge and discharge system 100. In an alternative embodiment, the power source in the multi-port fast charging way may comprise one USB port. A USB cable which has one connector at a first terminal and N connectors at a second terminal may be used to connect the power source to the N USB ports (21, 22, ..., 2N), wherein the first terminal having the one connector may be connected to the one USB port of the power source, and the second terminal having the N connectors may be connected to the N USB ports (21, 22, ..., 2N) of the multi-port battery charge and discharge system 100 respectively.

In the parallel charging way, only one of the N USB ports (21, 22, ..., 2N) of the multi-port battery charge and discharge system 100 may be connected to a power source to draw the input voltage signal $V_{IN}$. In such an application, only the port connecting switch (31 or 32, ..., or 3N) which is corresponding to the one USB port that is connected to the power source is turned on, and the remained port connecting switches are turned off. Meanwhile, the plurality of pin connecting switches (41, 42, ..., 4N-1) are turned on. Thus, the port connecting pins IN of the N voltage converting circuits (11-1, 11-2, ..., 11-N) may be connected together to receive the input voltage signal $V_{IN}$ from the one USB port that is connected to the power source. In such an application, a small size inductor may be adopted by each of the N voltage converting circuits (11-1, 11-2, ..., 11-N).

When operating in the charge state, no matter in the multi-source fast charging way application, the multi-port fast charging way application or the parallel charging way application, the multi-port battery charge and discharge system 100 may be operated to have a configuration of master-slave circuits application through configuring the address pins ADDR of the N voltage converting circuits (11-1, 11-2, ..., 11-N) to assign a master circuit (e.g., the voltage converting circuit 11-1) and N-1 slave circuits (e.g., the voltage converting circuits 11-2, ..., 11-N). Details of how to configure the N voltage converting circuits (11-1, 11-2, ..., 11-N) into a configuration of master-slave circuits application have been described in the above context of this disclosure and will not be addressed here again.

In the charge state, the battery voltage pin BAT and the battery current pin IBAT of the master circuit are activated to respectively sense the battery voltage of the battery pack 80 and the current flowing through the battery pack 80 and to respectively generate a battery voltage feedback signal $V_{BAT\_FB}$ and a battery current feedback signal $I_{CHA\_FB}$. In an embodiment, the battery voltage feedback signal $V_{BAT\_FB}$ is indicative of the battery voltage of the battery pack 80, and the battery current feedback signal $I_{CHA\_FB}$ is indicative of the current flowing through the battery pack 80. Furthermore, the master circuit (e.g., the voltage converting circuit 11-1 in the example of FIG. 1) is configured to generate a master current signal (e.g., the master current signal $I_{sys1}$) at its system pin SYS to supply the system load and charge the battery pack 80 based on the battery voltage feedback signal $V_{BAT\_FB}$ and the battery current feedback signal $I_{CHA\_FB}$. Meanwhile, the battery voltage pin BAT, the battery current pin IBAT and the driving pin BG of each of the N-1 slave circuits (e.g., the voltage converting circuits 11-2, ..., 11-N in the example of FIG. 1) are deactivated. The N-1 slave circuits are respectively configured to generate N-1 slave current signals (e.g., the slave current signals $I_{SYS2}$, ..., $I_{SYSN}$ in the example of FIG. 1) at their system pins SYS to complementally charge the battery pack 80. In an embodiment, the N-1 slave current signals may be predetermined and constant, and in such an application, each of the N-1 slave circuits may be operated as a current source to provide a predetermined and constant slave current signal. In an embodiment, the N-1 slave current signals may be the same. In other embodiment, the N-1 slave current signals may be different. For example, the first slave circuit (e.g., the voltage converting circuit 11-2 in the example of FIG. 1) may be configured to provide a first slave current signal (e.g., $I_{SYS2}$) of 2 A, and the N-1$^{th}$ slave circuit (e.g., the voltage converting circuit 11-N) may be configured to provide a N-1$^{th}$ slave current signal (e.g., $I_{SYSN}$) of 1 A.

In the discharge state, the multi-port battery charge and discharge system 100 may be configured to discharge the battery pack 80 to provide output voltage signals $V_{OUT}$ at port connecting pins IN of the N voltage converting circuits (11-1, 11-2, . . . , 11-N) to supply the associated power sinks (e.g., a mobile phone, a notebook, etc.) connected to the corresponding USB ports (21, 22, . . . , 2N). In such an application, the multi-port battery charge and discharge system 100 may be configured to have two discharging ways (configurations), i.e., a multi-port fast discharging way and a parallel discharging way, to supply the power sinks. In an embodiment, the port connecting pin IN of each of the N voltage converting circuits (11-1, 11-2, . . . , 11-N) can be configured to provide an output voltage signal $V_{OUT}$ with different voltage value in accordance with requirements of the USB specification, e.g., of 5V, 9V, 12V and 15V.

In the multi-port fast discharging way, all of the plurality of port connecting switches (31, 32, . . . , 3N) are turned on while the plurality of pin connecting switches (41, 42, . . . , 4N-1) are turned off. Thus each of the N USB ports 2i (i=1, 2, . . . , N) may be connected to the port connecting pin IN through the corresponding port connecting switch 3i (i=1, 2, . . . , N). Each of the N voltage converting circuits (11-1, 11-2, . . . , 11-N) may be configured to convert the system voltage signal $V_{SYS}$ to the output voltage signal $V_{OUT}$ and to provide the output voltage signal $V_{OUT}$ on its port connecting pin IN. One or more power sinks can be connected to the N USB ports (21, 22, . . . , 2N) to draw the output voltage signals $V_{OUT}$. For instance, in an embodiment, one USB port 2i (i=1, 2, . . . , N) may be connected to one power sink with a USB cable having one connector at a first terminal and one connector at a second terminal, wherein the one connector at the first terminal of the USB cable is connected to the one USB port 2i, and the one connector at the second terminal of the USB cable is connected to the one power sink. In an alternative embodiment, one USB port 2i (i=1, 2, . . . , N) may be connected to more than one (e.g. two or three) power sinks with a USB cable having one connector at a first terminal and more than one (e.g. two or three) connectors at a second terminal, wherein the one connector at the first terminal of the USB cable is connected to the one USB port 2i, and the more than one connectors at the second terminal of the USB cable are respectively connected to the more than one power sinks. In an alternative embodiment, more than one (e.g. two or three) of the N USB ports may be connected to one power sink to supply the one power sink simultaneously. A USB cable having more than one (e.g. two or three) connectors at a first terminal and one connector at a second terminal may be used to couple the more than one (e.g. two or three) of the N USB ports to the one power sink, wherein the more than one connectors at the first terminal of the USB cable are respectively connected to the more than one USB ports, and the one connector at the second terminal of the USB cable is connected to the one power sink.

In the parallel discharging way, only one of the N USB ports (21, 22, . . . , 2N) may be connected to a power sink. In such an application, only the port connecting switch (31 or 32, . . . , or 3N) which is corresponding to the one USB port that is connected to the power sink is turned on, and the remained port connecting switches are turned off. Meanwhile, the plurality of pin connecting switches (41, 42, . . . , 4N-1) are turned on. Thus, the port connecting pins IN of the N voltage converting circuits may be connected together to provide the output voltage signal $V_{OUT}$. A single power sink having one port may be connected to the one USB port to draw the output voltage signal $V_{OUT}$.

In the charge and discharge state, a first portion of the N voltage converting circuits (11-1, 11-2, . . . , 11-N) may be configured to operate in the charge mode to supply the system load and charge the battery pack 80, and a second portion of the N voltage converting circuits (11-1, 11-2, . . . , 11-N) may be configured to operate in the discharge mode to discharge the battery pack 80 to supply the associated power sinks. The operation process of the first portion of the N voltage converting circuits (11-1, 11-2, . . . , 11-N) operating in the charge mode may be similar with that described above for the voltage converting circuits (or for the multi-port battery charge and discharge system 100) operating at the charge state, and the operation process of the second portion of the N voltage converting circuits (11-1, 11-2, . . . , 11-N) operating at the discharge mode may be similar with that described above for the voltage converting circuits (or for the multi-port battery charge and discharge system 100) operating at the discharge state. In detail, the first portion of the N voltage converting circuits (11-1, 11-2, . . . , 11-N) operating in the charge mode can be configured to have three charging ways (configurations), i.e., the multi-source fast charging way, the multi-port fast charging way, and the parallel charging way, to supply the system load and charge the battery pack 80, and the second portion of the N voltage converting circuits (11-1, 11-2, . . . , 11-N) operating in the discharge mode can be configured to have two discharging ways (configurations), i.e., the multi-port fast discharging way and the parallel discharging way, to supply the power sinks. The detailed operation processes will not be described again.

In the exemplary embodiment of FIG. 1, each one of the N voltage converting circuits (11-1, 11-2, . . . , 11-N) may comprise a switching circuit which may have both the step-up voltage function and the step-down voltage function. For each one of the N voltage converting circuits (11-1, 11-2, . . . , 11-N), when the voltage across the port connecting pin IN is lower than the system voltage $V_{SYS}$, the switching circuit may be configured to operate in a step-up mode, and when the voltage across the port connecting pin IN is larger than the system voltage $V_{SYS}$, the switching circuit may be configured to operate in a step-down mode. For example, the switching circuit may have a buck-boost topology. When the voltage across the port connecting pin IN is lower than the system voltage $V_{SYS}$, the switching circuit may be configured to operate in a boost mode, and when the voltage across the port connecting pin IN is higher than the system voltage $V_{SYS}$, the switching circuit may be configured to operate in a buck mode, and when the voltage across the port connecting pin IN is close to the system voltage $V_{SYS}$, the switching circuit may be configured to operate in a buck-boost mode. In other embodiments, the switching circuit may comprise a topology circuit disclosed in the U.S. patent application Ser. No. 15/387,612 filed on Dec. 21, 2016, and U.S. patent application Ser. No. 15/387, 635 filed on Dec. 21, 2016. As described above, when the voltage converting circuit operates in the charge mode, the voltage across the port connecting pin IN may indicate the input voltage signal $V_{IN}$, and when the voltage converting circuit operates in the discharge mode, the voltage across the port connecting pin IN may indicate the output voltage signal $V_{OUT}$.

Figure 2:
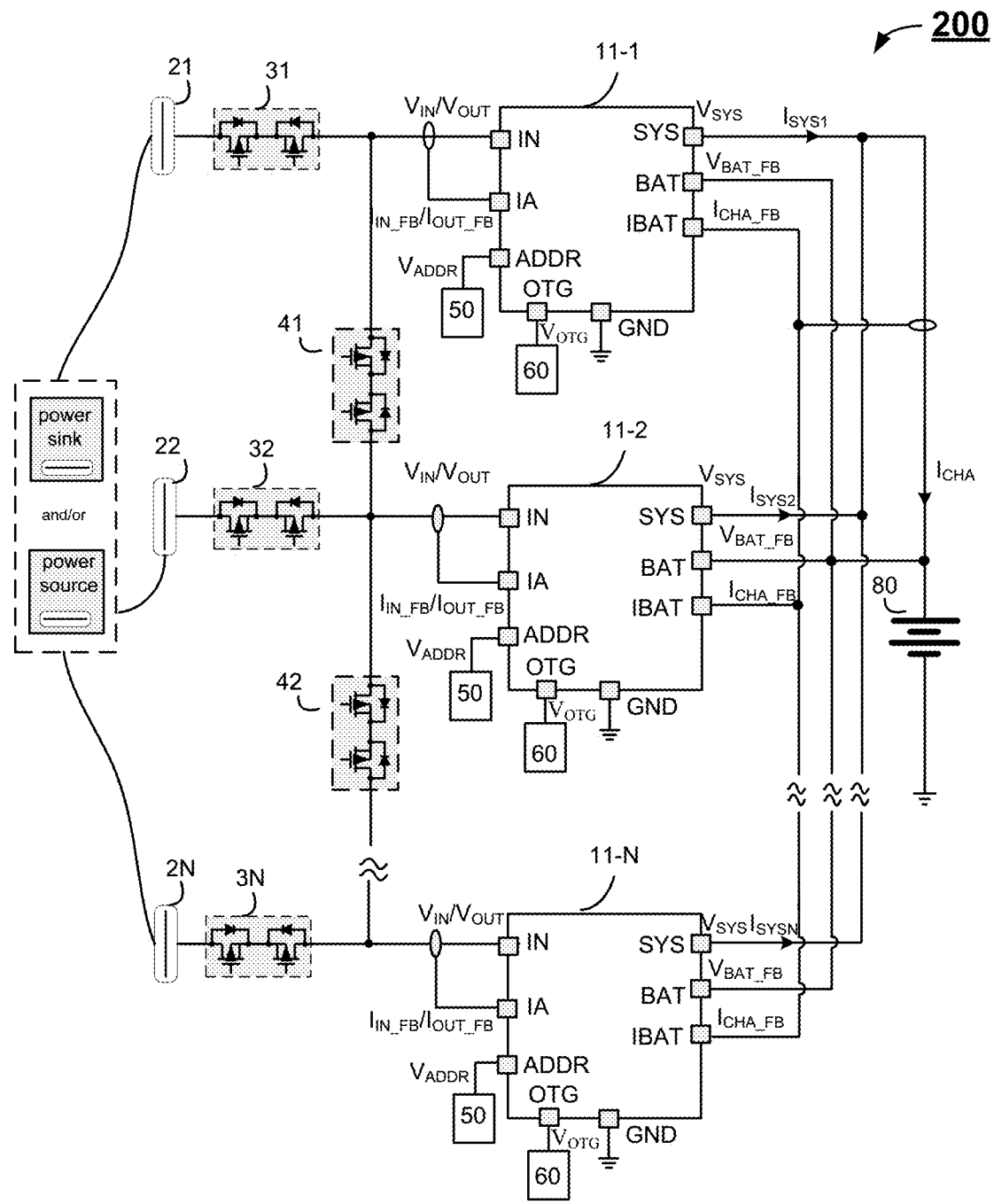
FIG. 2 schematically illustrates a multi-port battery charge and discharge system 200 in accordance with an alternative embodiment of the present invention.

FIG. 2 schematically illustrates a multi-port battery charge and discharge system 200 in accordance with an alternative embodiment of the present invention. Compared to the multi-port battery charge and discharge system 100, the multi-port battery charge and discharge system 200 may be configured to only charge the battery pack 80. Thus, the battery switch 70 may be omitted in the multi-port battery charge and discharge system 200. Correspondingly, the driving pin BG of each voltage converting circuit of the multi-port battery charge and discharge system 200 can be omitted. The connection relationships of the remained elements of the multi-port battery charge and discharge system 200 have been described with reference to FIG. 1, and the operation processes of the multi-port battery charge and discharge system 200 is similar with that of the multi-port battery charge and discharge system 100, thus both the connection relationships and operation processes will not be described again. In an embodiment, the multi-port battery charge and discharge system 200 may be applied in a power bank application.

Figure 3:
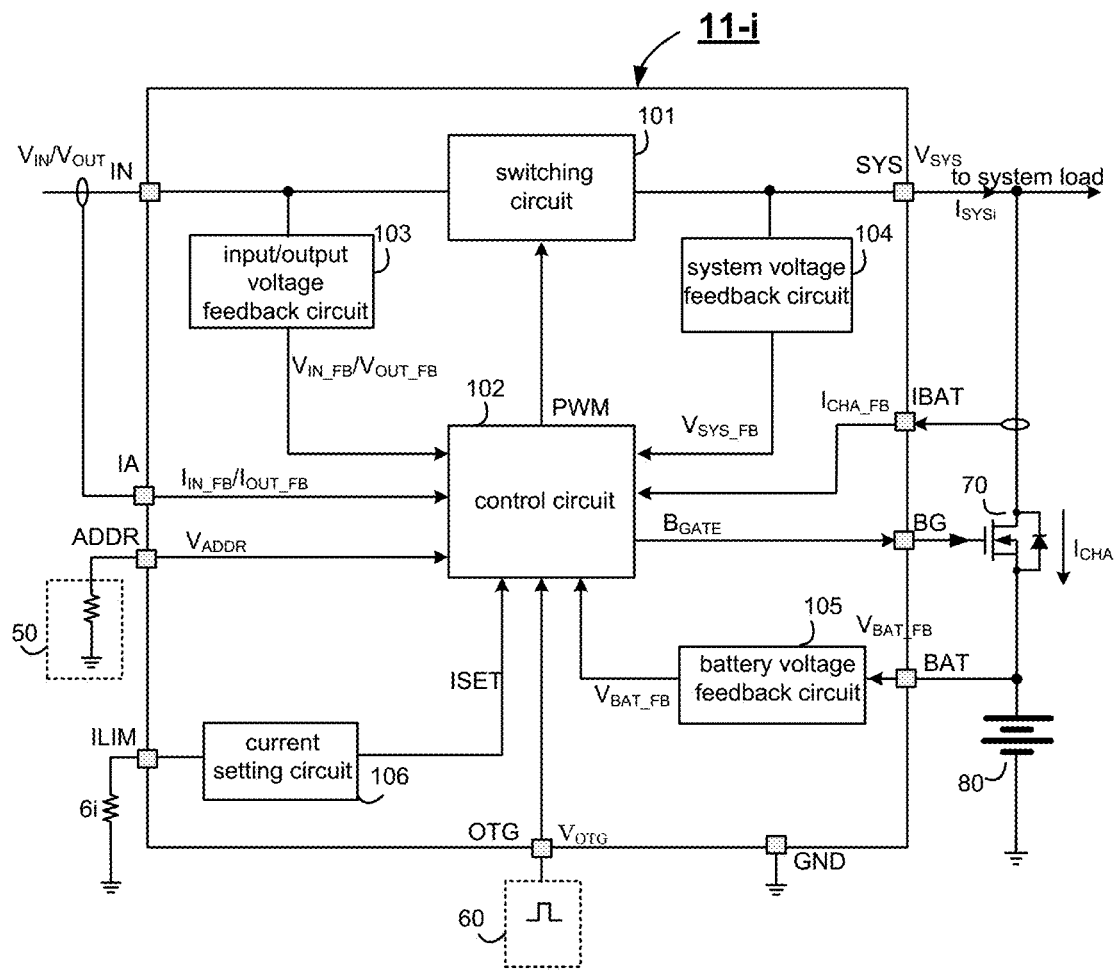
FIG. 3 schematically illustrates a block diagram of the voltage converting circuit 11-$i$ in FIGS. 1 and 2 in accordance with an embodiment of the present invention.

FIG. 3 schematically illustrates a block diagram of a voltage converting circuit 11-$i$ ($i=1, \ldots, N$) in FIGS. 1 and 2 in accordance with an embodiment of the present invention.

In the exemplary embodiment of FIG. 3, the voltage converting circuit 11-$i$ may comprise a switching circuit 101, a control circuit 102, and a plurality of feedback circuits, for example, an input/output voltage feedback circuit 103, a system voltage feedback circuit 104, and a battery voltage feedback circuit 105. It should be known to those of ordinary skill in the art that the plurality of feedback circuits are not limited to those illustrated in the embodiment shown in FIG. 3, other feedback circuits may also be included in the voltage converting circuit 11-$i$, such as a temperature feedback circuit.

As described above, when the voltage converting circuit 11-$i$ operates in the charge mode, the switching circuit 101 may be configured to convert the input voltage signal $V_{IN}$ to the system voltage signal $V_{SYS}$, when the voltage converting circuit 11-$i$ operates in the discharge mode, the switching circuit 101 may be configured to convert the system voltage signal $V_{SYS}$ to the output voltage signal $V_{OUT}$. The switching circuit 101 may be configured to operate in the step-up mode or the step-down mode depending on the voltage across the port connecting pin IN and the voltage value of the system voltage signal $V_{SYS}$.

The input/output voltage feedback circuit 103 may be configured to sense the voltage at the port connecting pin IN to generate a voltage feedback signal. In an embodiment, for example, in the charge mode of the voltage converting circuit 11-$i$, the port connecting pin IN may be configured to receive the input voltage signal $V_{IN}$ from the corresponding USB port 2$i$, thus the input/output voltage feedback circuit 103 may be configured to sense the input voltage signal $V_{IN}$, and the voltage feedback signal may be illustrated as an input voltage feedback signal $V_{IN\_FB}$ indicative of the input voltage signal $V_{IN}$. In the discharge mode of the voltage converting circuit 11-$i$, the port connecting pin IN may be configured to provide the output voltage signal $V_{OUT}$ to the corresponding USB port 2$i$, thus the input/output voltage feedback circuit 103 may be configured to sense the output voltage signal $V_{OUT}$, and the voltage feedback signal may be illustrated as an output voltage feedback signal $V_{OUT\_FB}$ indicative of the output voltage signal $V_{OUT}$.

The system voltage feedback circuit 104 may be configured to sense the system voltage signal $V_{SYS}$ to generate a system voltage feedback signal $V_{SYS\_FB}$ indicative of the system voltage signal $V_{SYS}$.

The battery voltage feedback circuit 105 may be configured to sense the battery voltage to generate a battery voltage feedback signal $V_{BAT\_FB}$ indicative of the voltage of the battery pack 80.

In the exemplary embodiment of the FIG. 3, the voltage converting circuit 11-$i$ may be an analogy circuit and may further comprise a current setting circuit 106 coupled to a current limiting pin ILIM of the voltage converting circuit 11-$i$. A current limiting resistor 6$i$ is connected between the current limiting pin ILIM and the logic ground. When the multi-port battery charge and discharge system 100 is in the master-slave circuits application and the voltage converting circuit 11-$i$ is operated as one of the slave circuits, the current setting circuit 106 and the current limiting resistor 6$i$ of the voltage converting circuit 11-$i$ may be configured to provide a current setting signal ISET to determine the value of the current signal $I_{SYSi}$ which is used to complementally charge the battery pack 80. It should be noted that, in other application, the current limiting pin ILIM may be omitted, and the current setting signal ISET may be provided by an internal module of the voltage converting circuit 11-$i$.

The control circuit 102 may be configured to receive the voltage feedback signal ($V_{IN\_FB}$ or $V_{OUT\_FB}$), the system voltage feedback signal $V_{SYS\_FB}$, the battery voltage feedback signal $V_{BAT\_FB}$, a current feedback signal from the current sense pin IA, the battery current feedback signal $I_{CHA\_FB}$ from the battery current pin IBAT, the current setting signal ISET, the OTG signal $V_{OTG}$ from the mode pin OTG and the address signal $V_{ADDR}$ from the address pin ADDR, and further configured to provide a group of switching control signals PWM to control switches of the switching circuit 101 and the driving signal $B_{GATE}$ to control the battery switch 70 on and off. In an embodiment, when the input voltage signal $V_{IN}$ is absent in the charge mode of the voltage converting 11-$i$, the control circuit 102 may be configured to provide the driving signal $B_{GATE}$ to turn on the battery switch 70 to supply the system load. In an embodiment, when any fault occurs in the multi-port battery charge and discharge system 100, the control circuit 102 may be configured to provide the driving signal $B_{GATE}$ to turn off the battery switch 70. In an embodiment, the address signal $V_{ADDR}$ may be configured to determine whether the voltage converting circuit 11-$i$ is operated as the master circuit or the slave circuit.

Figure 4:
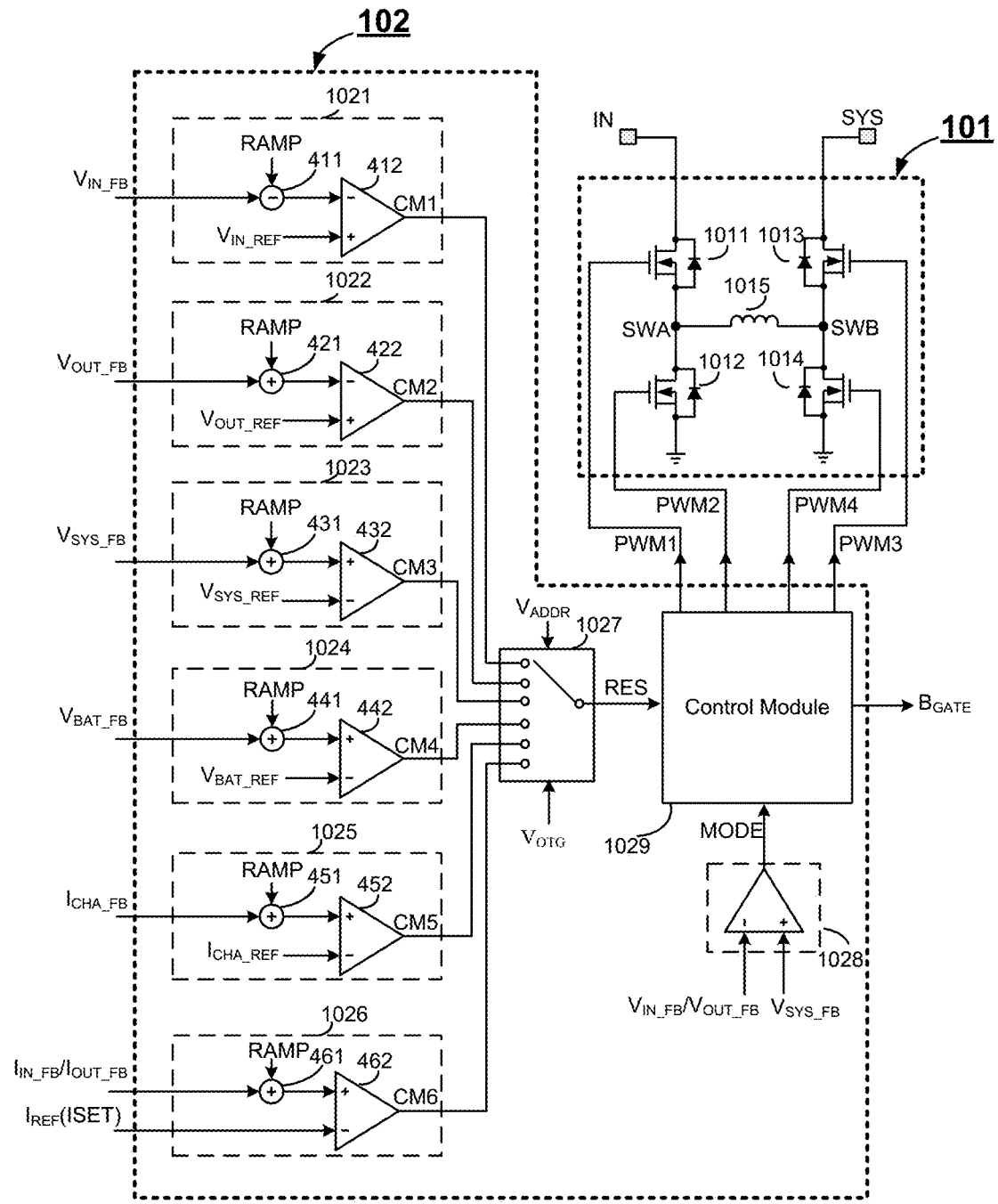
FIG. 4 schematically illustrates a block diagram of the switching circuit 101 and the control circuit 102 shown in FIG. 3 in accordance with an embodiment of the present invention.

FIG. 4 schematically illustrates a block diagram of the switching circuit 101 and the control circuit 102 shown in FIG. 3 in accordance with an embodiment of the present invention.

In the exemplary embodiment of FIG. 4, the switching circuit 101 is illustrated to have a BUCK-BOOST topology comprising a first switch 1011, a second switch 1012, a third switch 1013, a fourth switch 1014 and an inductor 1015. The first switch 1011 and the second switch 1012 are connected between the port connecting pin IN and the logic ground. The third switch 1013 and the fourth switch 1014 are connected between the system pin SYS and the logic ground. A common connection of the first switch 1011 and the second switch 1012 is labeled as SWA, and a common connection of the third switch 1013 and the fourth switch 1014 is labeled as SWB. The inductor 1015 is connected between the common connection SWA and the common connection SWB.

In the exemplary embodiment of FIG. 4, the control circuit 102 may comprise a plurality of feedback control loops 1021-1026, a data selector 1027, a comparing circuit 1028 and a control module 1029.

Each of the feedback control loops 1021-1026 may be configured to receive a feedback signal, a ramp signal RAMP and a reference signal, and may further be configured to provide a loop control signal. In an embodiment, each of the feedback control loops 1021-1026 may comprise an operating circuit and a comparing circuit, wherein the operating circuit may be configured to provide an operating signal based on the feedback signal and the ramp signal RAMP, and the comparing circuit may be configured to provide the loop control signal through comparing the operating signal with the reference signal.

In the exemplary embodiment of FIG. 4, the feedback control loop 1021 may be an input voltage control loop 1021, which is configured to provide an input voltage loop control signal CM1 through comparing a subtraction of the input voltage feedback signal $V_{IN\_FB}$ and the ramp signal RAMP ($V_{IN\_FB}$–RAMP) with an input voltage reference signal $V_{IN\_REF}$. The feedback control loop 1021 may comprise an operating circuit 411 and a comparing circuit 412. The operating circuit 411 is configured to receive the input voltage feedback signal $V_{IN\_FB}$ and the ramp signal RAMP, and is configured to subtract the ramp signal RAMP from the input voltage feedback signal $V_{IN\_FB}$ to provide an operating signal ($V_{IN\_FB}$–RAMP). The comparing circuit 412 may comprise an inverting input terminal coupled to the operating circuit 411 to receive the operating signal ($V_{IN\_FB}$–RAMP), a non-inverting input terminal configured to receive the input voltage reference signal $V_{IN\_REF}$, and an output terminal configured to provide the input voltage loop control signal CM1.

Feedback control loop 1022 may be an output voltage control loop 1022, which is configured to provide an output voltage loop control signal CM2 through comparing a summation of the output voltage feedback signal $V_{OUT\_FB}$ and ramp signal RAMP ($V_{OUT\_FB}$+RAMP) with an output voltage reference signal $V_{OUT\_REF}$. The feedback control loop 1022 may comprise an operating circuit 421 and a comparing circuit 422. The operating circuit 421 is configured to receive the output voltage feedback signal $V_{OUT\_FB}$ and the ramp signal RAMP, and is configured to superpose output voltage feedback signal $V_{OUT\_FB}$ with the ramp signal RAMP to provide an operating signal ($V_{OUT\_FB}$+RAMP). The comparing circuit 422 may comprise an inverting input terminal coupled to the operating circuit 421 to receive the operating signal ($V_{OUT\_FB}$+RAMP), a non-inverting input terminal configured to receive the output voltage feedback signal $V_{OUT\_FB}$, and an output terminal configured to provide the output voltage loop control signal CM2.

Feedback control loop 1023 may be a system voltage control loop 1023, which is configured to provide a system voltage loop control signal CM3 through comparing a summation of the system voltage feedback signal $V_{SYS\_FB}$ and the ramp signal RAMP ($V_{SYS\_FB}$+RAMP) with a system voltage reference signal $V_{SYS\_REF}$. The feedback control loop 1023 may comprise an operating circuit 431 and a comparing circuit 432. The operating circuit 431 is configured to receive the system voltage feedback signal $V_{SYS\_FB}$ and the ramp signal RAMP, and is configured to superpose the system voltage feedback signal $V_{SYS\_FB}$ with the ramp signal RAMP to provide an operating signal ($V_{SYS\_FB}$+RAMP). The comparing circuit 432 may comprise a non-inverting input terminal coupled to the operating circuit 431 to receive the operating signal ($V_{SYS\_FB}$+RAMP), an inverting input terminal configured to receive the system voltage reference signal $V_{SYS\_REF}$, and an output terminal configured to provide the system voltage loop control signal CM3.

Feedback control loop 1024 may be a battery voltage control loop 1024, which is configured to provide a battery voltage loop control signal CM4 through comparing a summation of the battery voltage feedback signal $V_{BAT\_FB}$ and the ramp signal RAMP ($V_{BAT\_FB}$+RAMP) with a battery voltage reference signal $V_{BAT\_REF}$. The feedback control loop 1024 may comprise an operating circuit 441 and a comparing circuit 442. The operating circuit 441 is configured to receive the battery voltage feedback signal $V_{BAT\_FB}$ and the ramp signal RAMP, and is configured to superpose the battery voltage feedback signal $V_{BAT\_FB}$ with the ramp signal RAMP to provide an operating signal ($V_{BAT\_FB}$+RAMP). The comparing circuit 442 may comprise a non-inverting input terminal coupled to the operating circuit 441 to receive the operating signal ($V_{BAT\_FB}$+RAMP), an inverting input terminal configured to receive the battery voltage reference signal $V_{BAT\_REF}$, and an output terminal configured to provide the battery voltage loop control signal CM4.

Feedback control loop 1025 may be a battery current control loop 1025, which is configured to provide a battery current loop control signal CM5 through comparing a summation of the battery current feedback signal $I_{CHA\_FB}$ and the ramp signal RAMP ($I_{CHA\_FB}$+RAMP) with a battery current reference signal $I_{CHA\_REF}$. The feedback control loop 1025 may comprise an operating circuit 451 and a comparing circuit 452. The operating circuit 451 is configured to receive the battery current feedback signal $I_{CHA\_FB}$ and the ramp signal RAMP, and is configured to superpose the battery current feedback signal $I_{CHA\_FB}$ with the ramp signal RAMP to provide an operating signal ($I_{CHA\_FB}$+RAMP). The comparing circuit 452 may comprise a non-inverting input terminal coupled to the operating circuit 451 to receive the operating signal $I_{CHA\_FB}$+RAMP, an inverting input terminal configured to receive the battery current reference signal $I_{CHA\_REF}$, and an output terminal configured to provide the battery current loop control signal CM5.

Feedback control loop 1026 may be an input/output current control loop 1026, which is configured to provide an input/output current loop control signal CM6 through comparing a summation of the input current feedback signal $I_{IN\_FB}$ (or the output current feedback signal $I_{OUT\_FB}$) and the ramp signal RAMP ($I_{IN\_FB}$+RAMP or $I_{OUT\_FB}$+RAMP) with a current reference signal $I_{REF}$. The feedback control loop 1026 may comprise an operating circuit 461 and a comparing circuit 462. The operating circuit 461 is configured to receive the input current feedback signal $I_{IN\_FB}$ (or the output current feedback signal $I_{OUT\_FB}$) and the ramp signal RAMP, and is configured to superpose the input current feedback signal $I_{IN\_FB}$ with the ramp signal RAMP to provide an operating signal ($I_{IN\_FB}$+RAMP) or to superpose the output current feedback signal $I_{OUT\_FB}$ with the ramp signal RAMP to provide an operating signal ($I_{OUT\_FB}$+RAMP). The comparing circuit 462 may comprise a non-inverting input terminal coupled to the operating circuit 431 to receive the operating signal ($I_{IN\_FB}$+RAMP) or ($I_{OUT\_FB}$+RAMP), an inverting input terminal configured to receive the current reference signal $I_{REF}$, and an output terminal configured to provide the current loop control signal CM6. In an embodiment, e.g., when the voltage converting circuit 11-$i$ serves as the slave circuit and is operated in the charge mode, the current reference signal $I_{REF}$ may comprise the current setting signal ISET used to determine the value of the current signal $I_{SYSi}$.

The data selector 1027 may be configured to receive the address signal $V_{ADDR}$, the OTG signal $V_{OTG}$ and the loop control signals CM1-CM6, and configured to select one or more appropriate loop control signals from the loop control signals CM1-CM6 according to the address signal $V_{ADDR}$ and the OTG signal $V_{OTG}$ to provide a logic signal RES. In an embodiment, the logic signal RES may vary in response to change in any of the loop control signals CM1-CM6, e.g., the logic signal RES may become high voltage level when any of the loop control signals CM1~CM6 becomes high voltage level. In an embodiment, for example, when the voltage converting circuit 11-$i$ is configured to operate in the charge mode for multiple circuits application and the converting circuit 11-$i$ is configured for the "master" operation, the data selector 1027 may be configured to select the input voltage control loop 1021, the system voltage control loop 1023, the battery voltage control loop 1024, the battery current control loop 1025 and the input/output current control loop 1026 to provide the corresponding loop control signals CM1-CM5 while to unselect the output voltage control loop 1022. In other embodiment, for example, when the voltage converting circuit 11-$i$ is configured to operate in the charge mode for multiple circuits application and the converting circuit 11-$i$ is configured for the "slave" operation, the data selector 1027 may be configured to select the current loop control signal CM6 while to unselect the input voltage control loop 1021, the output voltage control loop 1022, the system voltage control loop 1023, the battery voltage control loop 1024 and the battery current control loop 1025. In other embodiments, the control circuit 102 may further comprise a system current control loop for processing a system current feedback signal indicative of the system current signal $I_{SYSi}$. In such an application, when the voltage converting circuit 11-$i$ is configured to operate in the charge mode for multiple circuits application and the converting circuit 11-$i$ is configured for the "slave" operation, the data selector 1027 may be configured to select the system current control loop to provide a system current loop control signal while to unselect the input voltage control loop 1021, the output voltage control loop 1022, the system voltage control loop 1023, the battery voltage control loop 1024, the battery current control loop 1025 and the current control loop 1026.

The comparing circuit 1028 has a non-inverting input terminal configured to receive the input/output voltage feedback signal (the input voltage feedback signal $V_{IN\_FB}$ in the charge mode or the output voltage feedback signal $V_{OUT\_FB}$ in the discharge mode), an inverting input terminal configured to receive the system voltage feedback signal $V_{SYS\_FB}$, and an output terminal configured to provide a mode control signal MODE through comparing the input/output voltage feedback signal with the system voltage feedback signal $V_{SYS\_FB}$. When the input/output voltage feedback signal is higher than the system voltage feedback signal $V_{SYS\_FB}$, the mode control signal MODE becomes high voltage level, and the control module 1029 is configured to control the switching circuit 101 to work in the step-down mode. When the input/output voltage feedback signal is lower than the system voltage feedback signal $V_{SYS\_FB}$, the mode control signal MODE becomes low voltage level, and the control module 1029 is configured to control the switching circuit 101 to work in the step-up mode. The control module 1029 is coupled to the data selector 1027 to receive the logic signal RES and coupled to the comparing circuit 1028 to receive the mode control signal MODE, and is configured to provide the switching control signals PWM1-PWM4 and the driving signal BGATE based on the mode control signal MODE, and the logic signal RES.

Figure 5:
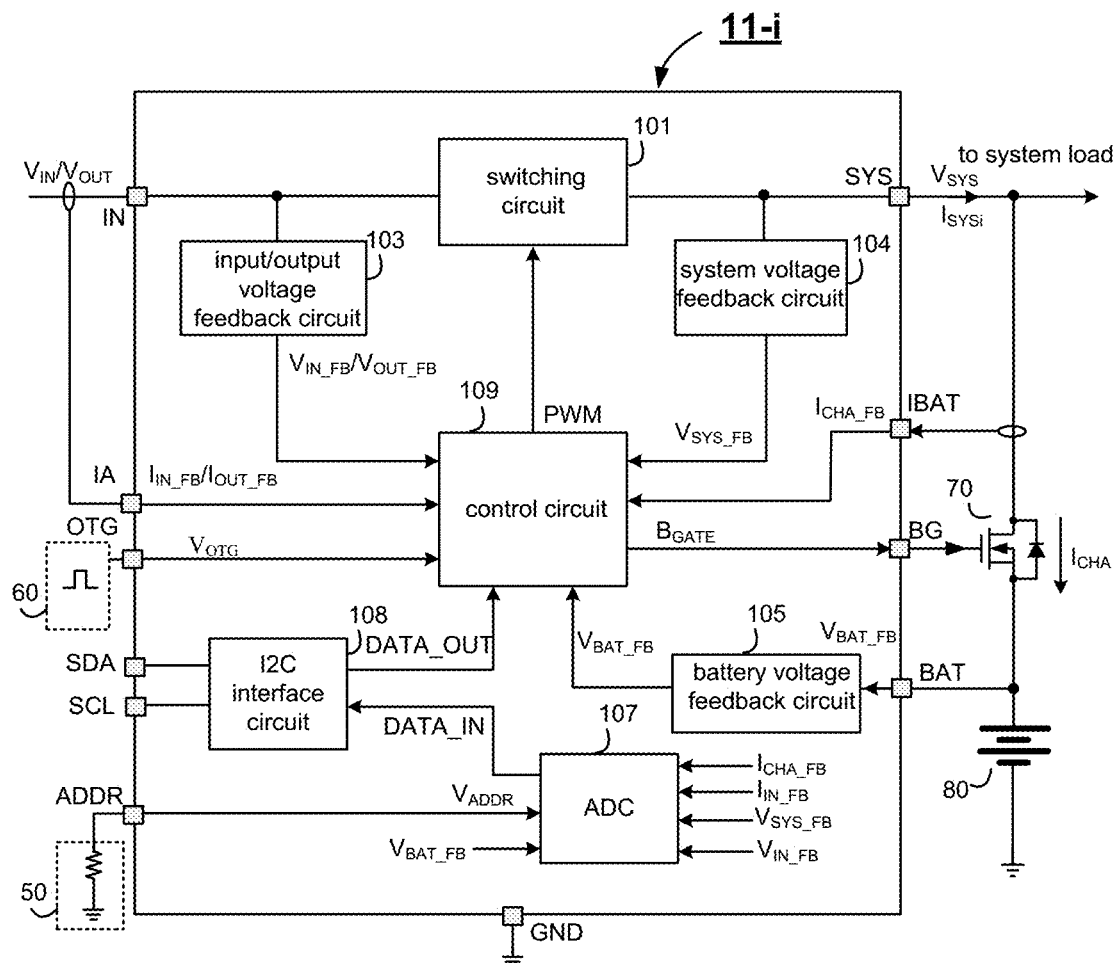
FIG. 5 schematically illustrates a block diagram of the voltage converting circuit 11-$i$ in FIGS. 1 and 2 in accordance with an alternative embodiment of the present invention.

FIG. 5 schematically illustrates a block diagram of the voltage converting circuit 11-$i$ ($i$=1, . . . , N) in FIGS. 1 and 2 in accordance with an alternative embodiment of the present invention.

Similar to the voltage converting circuit 11-$i$ of FIG. 3, the voltage converting circuit 11-$i$ of FIG. 5 may also comprise the switching circuit 101, and a plurality of feedback circuits, for example, the input/output voltage feedback circuit 103, the system voltage feedback circuit 104, and the battery voltage feedback circuit 105. The switching circuit 101, the input/output voltage feedback circuit 103, the system voltage feedback circuit 104 and the battery voltage feedback circuit 105 of FIG. 5 are the same as those of FIG. 3, thus they will not be described again. It should be known that the plurality of feedback circuits are not limited to the embodiment shown in FIG. 5, other feedback circuits may also be included in the voltage converting circuit 11-$i$, such as the temperature feedback circuit.

Compared to the analogy voltage converting circuit of FIG. 3, the voltage converting circuit 11-$i$ of FIG. 5 may be a mixed analog-digital circuit. The voltage converting circuit 11-$i$ of FIG. 5 may further comprise an Analog to Digital Converter (ADC) 107, an I2C interface circuit 108, a data pin SDA and a clock pin SCL. The ADC 107 may be configured to receive the input/output voltage feedback signal ($V_{IN\_FB}/V_{OUT\_FB}$), the system voltage feedback signal $V_{SYS\_FB}$, the input/output current feedback signal $I_{IN\_FB}/I_{OUT\_FB}$, the battery current feedback signal $I_{CHA\_FB}$, the battery voltage feedback signal $V_{BAT\_FB}$ and the address signal $V_{ADDR}$, and further configured to convert these received analog signals to a plurality of digital signals DATA_IN. The I2C interface circuit 108 may be configured to communicate with an external controller (such as MCU, SCM, EC, etc.) through the data pin SDA and the clock pin SCL. The I2C interface circuit 108 may be configured to receive the plurality of digital signals DATA_IN, and to transmit the plurality of digital signals DATA_IN to the external controller through the data pin SDA, the clock pin SCL and the associated bi-direction BUS lines. The external controller may be configured to provide instruction data, e.g., for setting operation mode, changing reference parameters, etc., through the associated bi-direction BUS lines, the data pin SDA and the clock pin SCL to the I2C interface circuit 108 based on the plurality of digital signals DATA_IN. The I2C interface circuit 108 receives the instruction data from the external controller, and provides a plurality of instruction signals DATA_OUT to a control circuit 109. In such an application, the current setting circuit just like the current setting circuit 106 of FIG. 3 can be omitted in the mixed analog-digital circuit.

The control circuit 109 may be configured to receive the input/output voltage feedback signal $V_{IN\_FB}/V_{OUT\_FB}$, the system voltage feedback signal $V_{SYS\_FB}$, the battery voltage feedback signal $V_{BAT\_FB}$, the input/output current feedback signal $I_{IN\_FB}/I_{OUT\_FB}$ from the current sense pin IA, the battery current feedback signal $I_{CHA\_FB}$ from the battery current pin IBAT, the OTG signal $V_{OTG}$ from the mode pin OTG and the plurality of instruction signals DATA_OUT, and further configured to provide a group of switching control signals PWM to control a plurality of switches of the switching circuit 101, and further configured to provide the driving signal $B_{GATE}$ to control the battery switch 70 on and off. In an embodiment, when any fault occurs in the multi-port battery charge and discharge system 100, the control circuit 109 may be configured to provide the driving signal $B_{GATE}$ to turn off the battery switch 70. It should be noted that in alternative embodiment, the voltage converting circuit 11-$i$ may comprise a digital controlled circuit having the same functions as the voltage converting circuit of FIG. 3 and the voltage converting circuit of FIG. 5.

Figure 6:
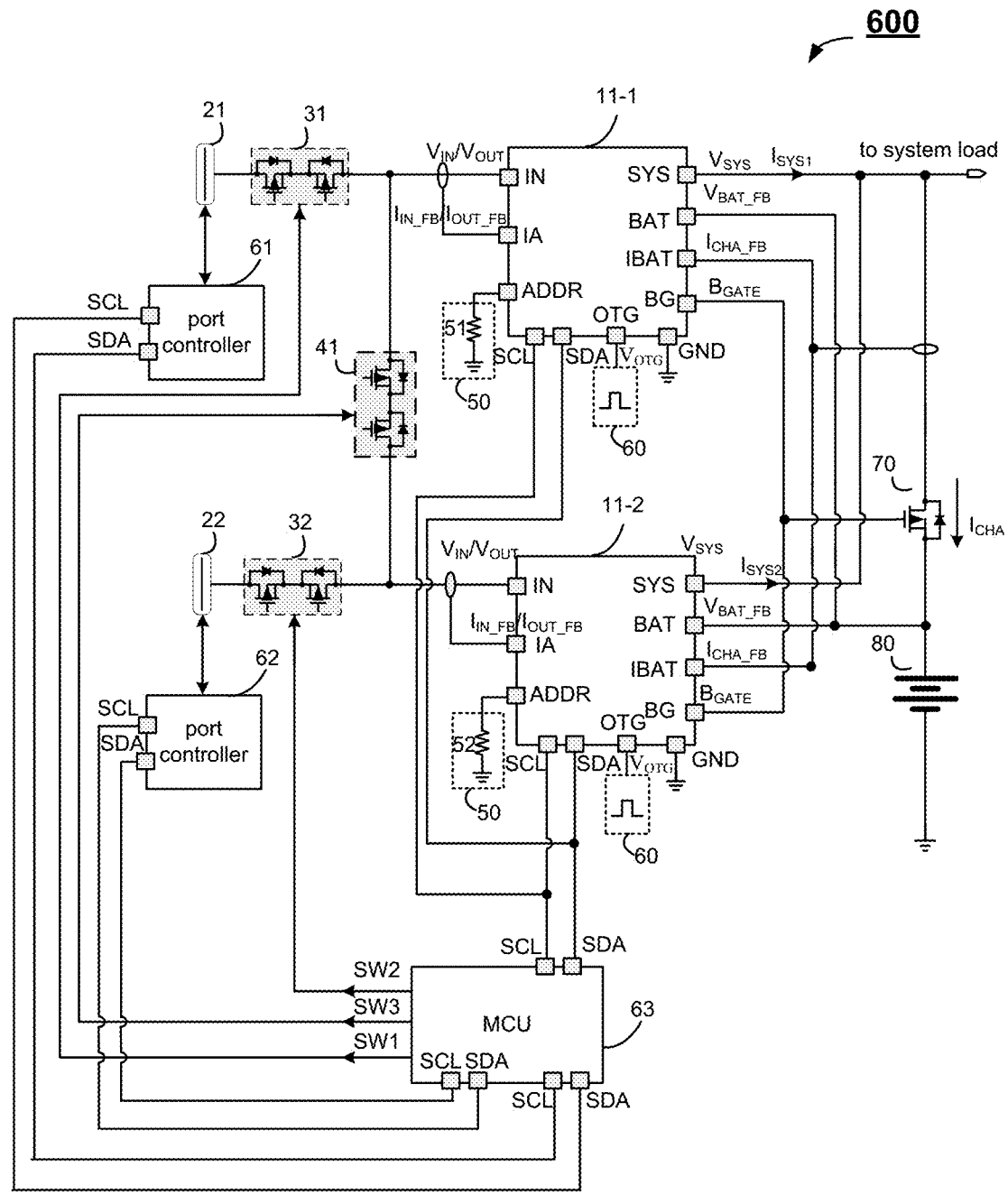
FIG. 6 schematically illustrates a multi-port battery charge and discharge system 600 in accordance with an embodiment of the present invention.

FIG. 6 schematically illustrates a multi-port battery charge and discharge system 600 in accordance with an embodiment of the present invention. As shown in FIG. 6, two mixed analog-digital voltage converting circuits 11-1 and 11-2 are shown for illustration. Besides the two mixed analog-digital voltage converting circuits 11-1 and 11-2, the multi-port battery charge and discharge system 600 may further comprise the USB port 21, the USB port 22, the port connecting switch 31, the port connecting switch 32, the pin connecting switch 41, the pin connecting switch 42, the external selection indicator 50, the mode selection indicator 60, the battery switch 70, the battery pack 80, a port controller 61, a port controller 62 and a MCU 63.

In the exemplary embodiment of FIG. 6, the mode pins OTG of the first voltage converting circuit 11-1 and the second voltage converting circuit 11-2 are respectively coupled to the mode selection indicator 60 to receive the OTG signal $V_{OTG}$ to determine whether the first voltage converting circuit 11-1 and the second voltage converting circuit 11-2 should operate in the charge mode or in the discharge mode. As mentioned in the embodiment of FIG. 1, when the OTG signal $V_{OTG}$ is at the high logic state, the corresponding voltage converting circuit may operate in the charge mode, when the OTG signal $V_{OTG}$ is at the low logic state, the corresponding voltage converting circuit may operate in the discharge mode.

The port connecting pin IN of the first voltage converting circuit 11-1 may be coupled to the USB port 21 through the port connecting switch 31. The port connecting pin IN of the second voltage converting circuit 11-2 may be coupled to the USB port 22 through the port connecting switch 32. The port connecting pin IN of the first voltage converting circuit 11-1 and the port connecting pin IN of the second voltage converting circuit 11-2 are coupled together through the pin connecting switch 41.

The current feedback pin IA of the first voltage converting circuit 11-1 may be coupled to the common connection of the port connecting switch 31 and the port connecting pin IN of the first voltage converting circuit 11-1 to receive the current feedback signal $I_{IN\_FB}/I_{OUT\_FB}$. The current feedback pin IA of the second voltage converting circuit 11-2 may be coupled to the common connection of the port connecting switch 32 and the port connecting pin IN of the second voltage converting circuit 11-2 to receive the current feedback signal $I_{IN\_FB}/I_{OUT\_FB}$.

The address pins ADDR of the first voltage converting circuit 11-1 and the second voltage converting circuit 11-2 are respectively connected to the external selection indicator 50. In the exemplary embodiment of FIG. 6, the external selection indicator 50 coupled to the address pin ADDR of the first voltage converting circuit 11-1 is illustrated as an address resistor 51 coupled between the address pin ADDR of the first voltage converting circuit 11-1 and the logic ground, and the external selection indicator 50 coupled to the address pin ADDR of the second voltage converting circuit 11-2 is illustrated as an address resistor 52 coupled between the address pin ADDR of the second voltage converting circuit 11-2 and the logic ground. In an embodiment, the resistance of the resistor 51 and the resistance of the address resistors 52 are different.

The system pin SYS of the first voltage converting circuit 11-1 and the system pin SYS of the second voltage converting circuit 11-2 may be connected together to the system load and the battery pack 80 through the battery switch 70, and each of the two voltage converting circuits 11-1 and 11-2 may be configured to provide the system voltage signal $V_{SYS}$ at the system pins SYS.

The battery voltage pin BAT of the first voltage converting circuit 11-1 and the battery voltage pin BAT of the second voltage converting circuit 11-2 may be connected together to receive a battery voltage feedback signal $V_{BAT\_FB}$ which is indicative of the voltage of the battery pack 80.

The battery current pin IBAT of the first voltage converting circuit 11-1 and the battery current pin IBAT of the second voltage converting circuit 11-2 may be connected together to receive a battery current feedback signal $I_{CHA\_FB}$ which is indicative of the current flowing through the battery pack 80.

The driving pin BG of the first voltage converting circuit 11-1 and the driving pin BG of the second voltage converting circuit 11-2 may be connected together to the control terminal of the battery switch 70. In an embodiment, the first voltage converting circuit 11-1 is configured to provide the driving signal $B_{GATE}$ to drive the battery switch 70, and the driving pin BG of the second voltage converting circuit 11-2 is disabled. In other embodiments, the first voltage converting circuit 11-1 is disabled, and the driving pin BG of the second voltage converting circuit 11-2 is configured to provide the driving signal $B_{GATE}$ to drive the battery switch 70.

The ground pin GND of the first voltage converting circuit 11-1 and the ground pin GND of the second voltage converting circuit 11-2 may be connected to the logic ground.

The clock pin SCL of the first voltage converting circuit 11-1 and the clock pin SCL of the second voltage converting circuit 11-2 may be connected together to the clock pin SCL of the MCU 63. The data pin SDA of the first voltage converting circuit 11-1 and the data pin SDA of the second voltage converting circuit 11-2 may be connected together to the data pin SDA of the MCU 63.

The port controller 61 may be coupled between the USB port 21 and the MCU 63. The port controller 62 may be coupled between the USB port 22 and the MCU 63. The port controller 61 and the port controller 62 may be appropriately chosen in accordance with requirements of the USB specification. In an embodiment, in a USB-Power Delivery (USB PD) charging application, the port controller 61 may comprise a PD controller. In an embodiment, in the USB-Type-C (TC) charging application, the port controller 61 may comprise a TC controller.

The port controller 61 may be configured to sense a voltage and a current of the USB port 21, and transmit the sensed voltage and the sensed current to the MCU 63. The port controller 62 may be configured to sense a voltage and a current of the USB port 22, and transmit the sensed voltage and the sensed current to the MCU 63. The MCU 63 may be configured to receive and process the sensed voltages and sensed currents from the port controller 61 and the port controller 62, and further configured to output instruction data to the port controller 61 to control the voltage and the current of the USB port 21, and to the port controller 62 to control the voltage and the current of the USB port 22. In the exemplary embodiment of FIG. 6, both the port controller 61 and the port controller 62 may also comprise a data pin SDA and a clock pin SCL, and the port controller 61 and the port controller 62 are communicated with the MCU 63 through the data pin SDA, the clock pin SCL and the corresponding bi-direction BUS lines. Furthermore, the MCU 63 may further be configured to generate a group of switching control signals SW1-SW3 to respectively control the port connecting switch 31, the port connecting switch 32 and the pin connecting switch 41 on and off. Then, the multi-port battery charge and discharge system 600 may be able to have a configuration of the multi-source fast charging way, the multi-port fast charging way, the parallel charging way, the multi-port fast discharging way or the parallel discharging way according to different applications.

In some applications requiring a high thermal dissipation, the foregoing embodiments may be unsatisfied with the thermal dissipation requirement. Likewise, in some applications requiring a smaller inductor size, the foregoing architectures also need to be improved. Furthermore, when a multi-port battery charge and discharge system operates in the charge and discharge state, a portion of the N voltage converting circuits (11-1, 11-2, . . . , 11-N) may operate in the charge mode to supply the system load and charge the battery pack 80, and the remained portion of the N voltage converting circuits (11-1, 11-2, . . . , 11-N) may operate in the discharge mode to discharge the battery pack 80 to supply the associated power sinks as mentioned above. On the condition that a few of voltage converting circuits are operated in the charge mode to draw in power from the corresponding USB port while most of voltage converting circuits are operated in the discharge mode to draw out the power from the battery pack 80, the foregoing architectures will have to reduce its total charging power since only few voltage converting circuits are utilized to charge which may result in a slow charging rate.

In the following embodiments, more elegant and efficient architecture solutions are further proposed.

Figure 7:
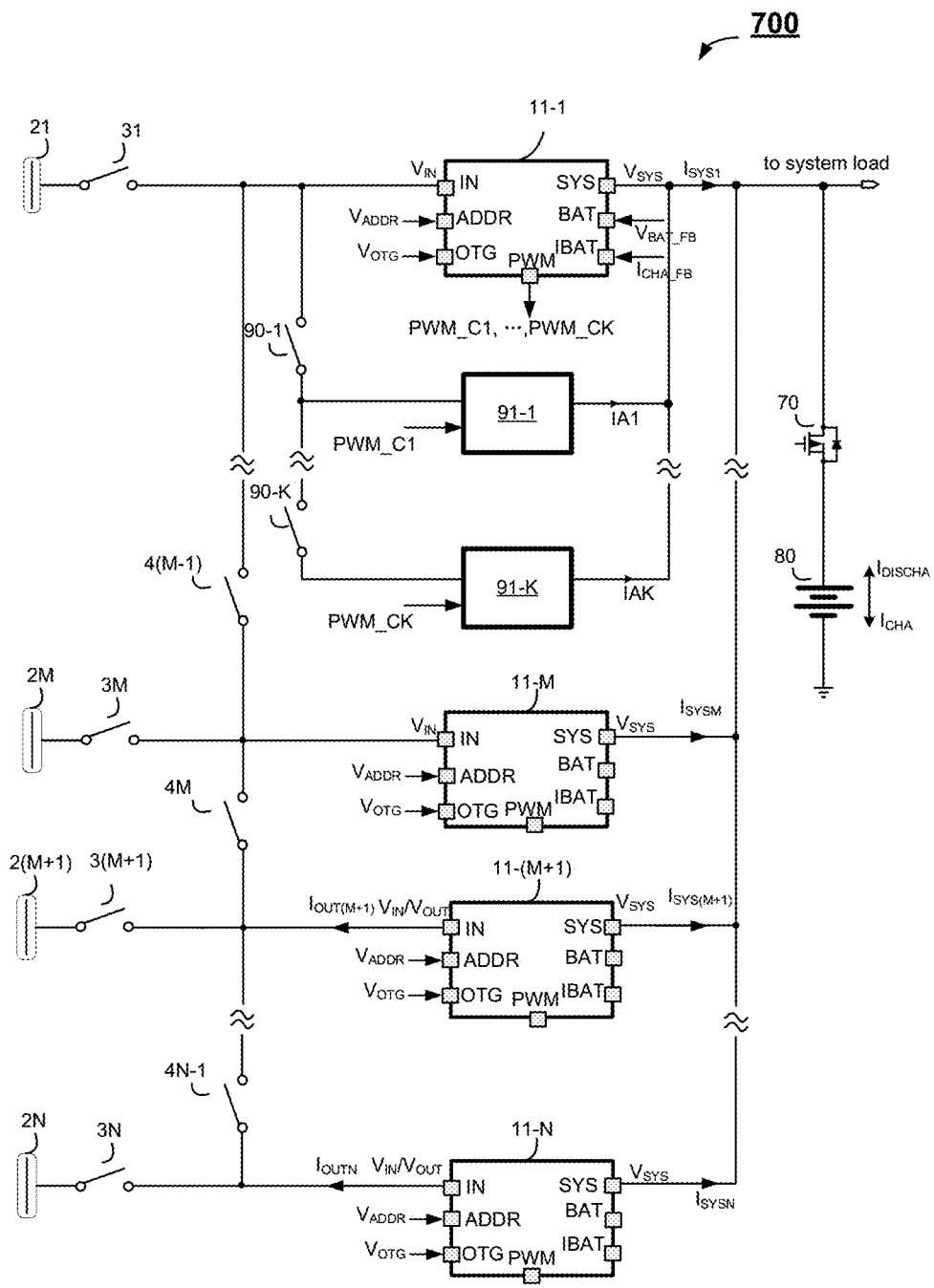
FIG. 7 schematically illustrates a multi-port battery charge and discharge system 700 in accordance with an embodiment of the present invention.

FIG. 7 schematically illustrates a multi-port battery charge and discharge system 700 in accordance with an embodiment of the present invention. As shown in FIG. 7, the multi-port battery charge and discharge system 700 may comprise N voltage converting circuits (11-1, . . . , 11-M, 11-(M+1), . . . , 11-N), wherein M is an integer greater than or equal to 1 and smaller than N. Furthermore, the multi-port battery charge and discharge system 700 may also comprise N USB ports (21, . . . , 2M, 2(M+1), . . . , 2N) corresponding to the N voltage converting circuits (11-1, . . . , 11-M, 11-(M+1), . . . , 11-N), a plurality of port connecting switches (31, . . . , 3M, 3(M+1), . . . , 3N), a plurality of pin connecting switches (41, . . . , 4(M−1), 4M, . . . , 4(N−1)), the battery switch 70 and the battery pack 80. In an embodiment, the connection relationships of the N USB ports (21, . . . , 2M, 2(M+1), . . . , 2N), the N voltage converting circuits (11-1, . . . , 11-M, 11-(M+1), . . . , 11-N), the plurality of port connecting switches (31, . . . , 3M, 3(M+1), . . . , 3N), and the plurality of pin connecting switches (41, . . . , 4(M−1), 4M, . . . , 4(N−1)) are the same as those described in the embodiment of FIG. 1. One of ordinary skill in the art would understand that the value of N and the value of M can be flexibly chosen depending on design specifications without departing from the scope of the present disclosure. As can be appreciated by one of ordinary skill in the art, the plurality of port connecting switches (31, . . . , 3M, 3(M+1), . . . , 3N) and the plurality of pin connecting switches (41, . . . , 4(M−1), 4M, . . . , 4(N−1)) may comprise any suitable semiconductor devices having a bi-directional blocking function or an unidirectional blocking function, such as Metal Oxide Semiconductor Field Effect Transistors ("MOSFETs"), Junction Field Effect Transistors ("JFETs"), Insulated Gate Bipolar Translators ("IGBTs") etc. Likewise, whereas the battery switch 70 is illustrated as a MOSFET in FIG. 7, in other embodiments, the battery switch 70 may comprise any suitable semiconductor devices having the bi-directional blocking function or the unidirectional blocking function, such as a JFET, an IGBT etc.

In an exemplary embodiment, when the multi-port battery charge and discharge system 700 is configured to operate in the charge and discharge state, a first portion of the N voltage converting circuits (11-1, 11-2, . . . , 11-M) may operate in the charge mode and a second portion of the N voltage converting circuits (11-(M+1), 11-(M+2), . . . , 11-N) may operate in the discharge mode. The operation process of the first portion of the N voltage converting circuits (11-1, 11-2, . . . , 11-M) may be similar with that of the voltage converting circuits operating at the charge state described above, and the operation process of the second portion of the N voltage converting circuits (11-(M+1), 11-(M+2), . . . , 11-N) may be similar with that of the voltage converting circuits operating at the discharge state described above. In detail, the first portion of the N voltage converting circuits (11-1, 11-2, . . . , 11-M) operating in the charge state may be configured for three charging ways, i.e., the multi-source fast charging way, the multi-port fast charging way, and the parallel charging way, to supply the system load and charge the battery pack 80. The second portion of the N voltage converting circuits (11-(M+1), 11-(M+2), . . . , 11-N) operating in the discharge state may be configured for two discharging ways, i.e., the multi-port fast discharging way and the parallel discharging way, to supply the power sinks.

In an exemplary embodiment of FIG. 7, if M is greater than or equal to 2, i.e., the first portion of the N voltage converting circuits (11-1, . . . , 11-M) may comprise at least two voltage converting circuits to operate in the charge mode. The first portion of the N voltage converting circuits (11-1, . . . , 11-M) may be operated to have a configuration of master-slave circuits application through configuring the address pin ADDR of each of the first portion of the N voltage converting circuits (11-1, 11-2, . . . , 11-M) to assign a master circuit (e.g., the voltage converting circuit 11-1) and M−1 slave circuits (e.g., the voltage converting circuits (11-2, . . . , 11-M)). The master circuit may be configured to operate in a "master" mode to generate a master current signal (e.g., the master current signal $I_{SYS1}$) at its system pin SYS. In an embodiment, the battery voltage pin BAT and the battery current pin IBAT of the master circuit are activated to respectively receive the battery voltage feedback signal $V_{BAT\_FB}$ and the battery current feedback signal $I_{CHA\_FB}$, and the master circuit is configured to generate the master current signal based on the battery voltage feedback signal $V_{BAT\_FB}$ and the battery current feedback signal $I_{CHA\_FB}$. The M−1 slave circuits may be configured to operate in a "slave" mode to respectively generate M−1 slave current signals (e.g., the slave current signals $I_{SYS2}, \ldots, I_{SYSM}$) at their system pins SYS to complementally charge the battery pack 80. In an embodiment, the M−1 slave current signals may be predetermined and constant. In such an application, each of the M−1 slave circuits is operated as a current source to provide a predetermined and constant slave current signal.

In an exemplary embodiment of FIG. 7, if M is equal to 1, i.e., only one voltage converting circuit (e.g., the voltage converting circuit 11-1) may be configured to operate in the charge mode. In such an application, the only one voltage converting circuit is the master circuit whose battery voltage pin BAT and battery current pin IBAT are activated to receive the battery voltage feedback signal $V_{BAT\_FB}$ and the battery current feedback signal $I_{CHA\_FB}$. And then the master circuit may be configured to generate the master current signal $I_{sys1}$ based on the battery voltage feedback signal $V_{BAT\_FB}$ and the battery current feedback signal $I_{CHA\_FB}$ at its system pin SYS.

In an embodiment, the multi-port battery charge and discharge system 700 may also be configured to operate in the charge state in which both the first portion of the N voltage converting circuits (11-1, 11-2, . . . , 11-M) and the second portion of the N voltage converting circuits (11-(M+1), 11-(M+2), . . . , 11-N) may be configured to operate in the charge mode. In such an application, each one of the second portion of the N voltage converting circuits (11-(M+1), 11-(M+2), . . . , 11-N) may be configured as a slave circuit to provide a supplemental charging current signal at its system pin SYS respectively.

As can also be appreciated, the plurality of port connecting switches (31, . . . , 3M, 3(M+1), . . . , 3N) and the plurality of pin connecting switches (41, . . . , 4(M−1), 4M, . . . , 4(N−1)) of the multi-port battery charge and discharge system 700 are utilized by customers to configure operation states and operation ways. For instance, when the multi-port battery charge and discharge system 700 is configured to operate in the charge and discharge state, the pin connecting switch 4M should be in an off state while the states of the remained pin connecting switches (41, . . . , 4(M−1), 4(M+1), . . . , 4(N−1)) and the plurality of port connecting switches (31, . . . , 3M, 3(M+1), . . . , 3N) are depended on the difference operation ways the multi-port battery charge and discharge system 700 is configured for. In more detail, the first portion of the N voltage converting circuits (11-1, 11-2, . . . , 11-M) operating in the charge mode can be configured for the multi-source fast charging way, the multi-port fast charging way or the parallel charging way through controlling the plurality of port connecting switches (31, . . . , 3M) and the plurality of pin connecting switches (41, . . . , 4(M−1)) on and off; and the second portion of the N voltage converting circuits (11-(M+1), 11-(M+2), . . . , 11-N) operating in the discharge mode can be configured for the multi-port fast discharging way or the parallel discharging way through controlling the plurality of port connecting switches (31(M+1), . . . , 3N) and the plurality of pin connecting switches (4(M+1), . . . , 4(N−1)) on and off. However, in some dedicated applications, for example, if customers have determined which operation way a multi-port battery charge and discharge system is configured for in advance, all the plurality of port connecting switches (31, . . . , 3N) and the plurality of pin connecting switches (41, . . . , 4(N−1)) may be omitted.

With continued reference to FIG. 7, the multi-port battery charge and discharge system 700 may further comprise a plurality of switch modules (91-1, . . . , 91-K), wherein K is an integer equal to or greater than 1. Also note that one of ordinary skill in the art would understand that the value of K can be flexibly chosen depending on design specifications without departing from the scope of the present disclosure. In an embodiment, for each j=1, . . . , K, the switch module 91-$j$ may have an input terminal and an output terminal. For each j=1, . . . , K, the input terminal of the switch module 91-$j$ may be coupled together to the port connecting pin IN of one of the plurality of the voltage converting circuits which is operated as a master circuit to generate a master current signal, e.g., the voltage converting circuit 11-1, and the output terminal of the switch module 91-$j$ may be coupled together to the system pin SYS of the master circuit. It should be understood, for each j=1, . . . , K, the input terminal of the switch module 91-$j$ may be coupled between the port connecting pin IN and the system pin SYS of any one of the N voltage converting circuits (11-1, 11-2, . . . , 11-N) operated as the master circuit. For example, if the voltage converting circuits 11-M is operated as the master circuit to generate the master current signal, the input terminal of the switch module 91-$j$ could be coupled between the port connecting pin IN and the system pin SYS of the voltage converting circuits 11-M. In an embodiment, for each j=1, . . . , K, the switch module 91-$j$ may be configured to generate an additional current signal IA$j$ to charge the battery pack 80 at its output terminal once the switch module 91-$j$ is enabled. As used herein, the term "enable", as applied to the switch module 91-$j$, mean that the switch module 91-$j$ is enable to conduct current which is could otherwise block.

In an embodiment, for each j=1, . . . , K, an average value of the additional current signal IA$j$ of the corresponding switch module 91-$j$ may be equal to an average value of the additional current signal IA(j+1) of the corresponding switch module 91-(j+1), and equal to an average value of the master current signal. Herein, for each j=1, . . . , K, the average value of the additional current signal IA$j$ is defined as a Root-Mean-Square (RMS) value of the additional current signal IA$j$ in one switching period of the multi-port battery charge and discharge system 700. In other embodiments, the average value of the master current signal may be multiple of the average value of the additional current signal IA$j$. The ratio of the average value of the master current signal and the average value of the additional current signal IA$j$ may depend on a topology of a switching circuit that the N voltage converting circuits (11-1, 11-2, . . . , 11-N) have. Herein, the average value of the master current signal is defined as a RMS value of the master current signal in one switching period of the multi-port battery charge and discharge system 700.

In the exemplary embodiment of FIG. 7, for each i=1, . . . , N, the voltage converting circuits 11-$i$ may further comprise a control pin PWM. In an embodiment, the control pin PWM of the master circuit which generates the master current signal may be configured to provide a plurality of switching module control signal (PWMC1, . . . , PWMCK) to respectively control each of the K switch modules (91-1, . . . , 91-K) on and off. In an embodiment, for each j=1, . . . , K, the switch module 91-$j$ may comprise at least one charging switch, and the switching module control signal PWMC$j$ is configured to control the at least one charging switch of the switch module 91-$j$. For example, the switching module control signal PWMC1 is configured to control the at least one charging switch of the first switch module 91-1, and the switching module control signal PWMCK is configured to control the at least one charging switch of the $K^{th}$ switch module 91-K, and so forth.

In accordance with the present disclosure, there are many ways to enable the plurality of switch modules (91-1, . . . , 91-K). In an exemplary embodiment, for each j=1, . . . , K, the switching module control signal PWMC$j$ is configured to determine whether the corresponding switch module 91-$j$ is enabled or disabled. For example, in an embodiment, the switch module 91-$j$ may be disabled through setting a Hi-Z state of the switching module control signal PWMC$j$ in which the at least one charging switch of the switch module 91-$j$ is unable to be turned on or off. In an embodiment, the Hi-Z state of the switching module control signal PWMC$j$ means the state of the switching module control signal PWMC$j$ is neither a logic high state nor a logic low sate. In other embodiment, the switch module 91-$j$ may be disabled through setting a Hi-Z state of the at least one charging switch of the switch module 91-$j$, wherein the Hi-Z state of the at least one charging switch of the switch module 91-$j$ means the control terminal of each of the at least one charging switch of the switch module 91-$j$ is floating. Further in another embodiment, the switch module 91-$j$ may be disabled through turning all of the at least one charging switch of the switch module 91-$j$ off.

In an exemplary embodiment, for each j=1, . . . , K, other elements rather than the switching module control signal PWMC$j$ may be adopted to enable the corresponding switch module 91-$j$. For instance, with reference to FIG. 7, the multi-port battery charge and discharge system 700 may further comprise a plurality of extra switches (90-1, . . . , 90-K) each one of which may be configured to determine whether to enable the corresponding one of the plurality of switch modules (91-1, . . . , 91-K). Each one of the plurality of extra switches (90-1, . . . , 90-K) are respectively corresponding to one of the plurality of switch modules (91-1, . . . , 91-K). As shown in FIG. 7, for each j=1, . . . , K, the input terminal of the switch module 91-j may be coupled to the port connecting pin IN of the master circuit through the corresponding extra switch 90-j, and the switch module 91-j is enabled when the corresponding extra switch 90-j is turned on. In an embodiment, the additional current signal IN is generated through controlling the at least one charging switch of the switch module 91-j on and off once the corresponding extra switch 90-j is turned on. It should be understood, if M is equal to 1, the only one voltage converting circuit operating in the charge mode can be regarded as the master circuit. Similarly with the plurality of port connecting switches (31, . . . , 3M, 3(M+1), . . . , 3N) and the plurality of pin connecting switches (41, . . . , 4(M−1), 4M, . . . , 4(N−1)), the plurality of extra switches (90-1, . . . , 90-K) may also comprise any suitable semiconductor devices having a bi-directional blocking function or an unidirectional blocking function, such as MOSFETs, JFETs, or IGBTs, etc.

Generally, each of the plurality of switch modules (91-1, . . . , 91-K) may be presented as an individual integrated circuit (IC). Compared to those embodiments shown in FIGS. 1-6, the multi-port battery charge and discharge system 700 may have an improved thermals performance because the heat can be spread across more ICs.

With continued reference to FIG. 7. In an embodiment, for each j=1, . . . , K, the switch module 91-j may comprise a first charging switch and a second charging switch, and the switching module control signal PWMCj may comprise a first charging switch control signal and a second charging switch control signal respectively to control the first charging switch and the second charging switch. In an embodiment, for each j=1, . . . , K, the first charging switch control signal of the switch module 91-j is the same as the switching control signal PWM1 illustrated in FIG. 4, i.e., the first charging switch of the switch module 91-j is turned on and off synchronously with the first switch 1011 illustrated in FIG. 4. And for each j=1, . . . , K, the second charging switch control signal of the switch module 91-j is the same as the switching control signal PWM2 illustrated in FIG. 4, i.e., the second charging switch of the switch module 91-j is turned on and off synchronously with the second switch 1012 illustrated in FIG. 4.

In an alternative embodiment, the first switch 1011, the first charging switch of the first switch module 91-1, . . . , the first charging switch of the $K^{th}$ switch module 91-K are successively interleaved to turn on and off; the second switch 1012, the second charging switch of the first switch module 91-1, . . . , the second charging switch of the $K^{th}$ switch module 91-K are successively interleaved to turn on and off. In such an application, every two successively neighboring control signals among the first charging switch control signals of the plurality of switch modules (91-1, . . . , 91-K) and the switching control signal PWM1 may have a predetermined identical phase shift of 360°/(K+1) in sequence. Meanwhile, every two successively neighboring control signals of the second charging switch control signals of the plurality of switch modules (91-1, . . . , 91-K) and the switching control signal PWM2 may have a predetermined identical phase shift of 360°/(K+1) in sequence. For example, if K=1, the switching control signal PWM1 and the first charging switch control signal of the first switch module 91-1 have a phase shift of 180°, and the switching control signal PWM2 and the second charging switch control signal of the first switch module 91-1 have the phase shift of 180°. If K=2, the switching control signal PWM1 and the first charging switch control signal of the first switch module 91-1 have a phase shift of 120°, the first charging switch control signal of the first switch module 91-1 and the first charging switch control signal of the second switch module 91-2 have the phase shift of 120°, and the first charging switch control signal of the second switch module 91-2 and the switching control signal PWM1 have the phase shift of 120°. Meanwhile, the switching control signal PWM2 and the second charging switch control signal of the first switch module 91-1 have a phase shift of 120°, the second charging switch control signal of the first switch module 91-1 and the second charging switch control signal of the second switch module 91-2 have the phase shift of 120°, and the second charging switch control signal of the second switch module 91-2 and the switching control signal PWM2 have the phase shift of 120°. And so forth.

In an embodiment, the multi-port battery charge and discharge system 700 may further comprises a data pin similarly as the data pin SDA illustrated in FIG. 6) connected to a microprocessor (such as MCU 63 illustrated in FIG. 6). In an embodiment, the microprocessor is configured to generate a plurality of extra switch control signals to control the plurality of extra switches (90-1, . . . , 90-K) on and off respectively.

Figure 8:
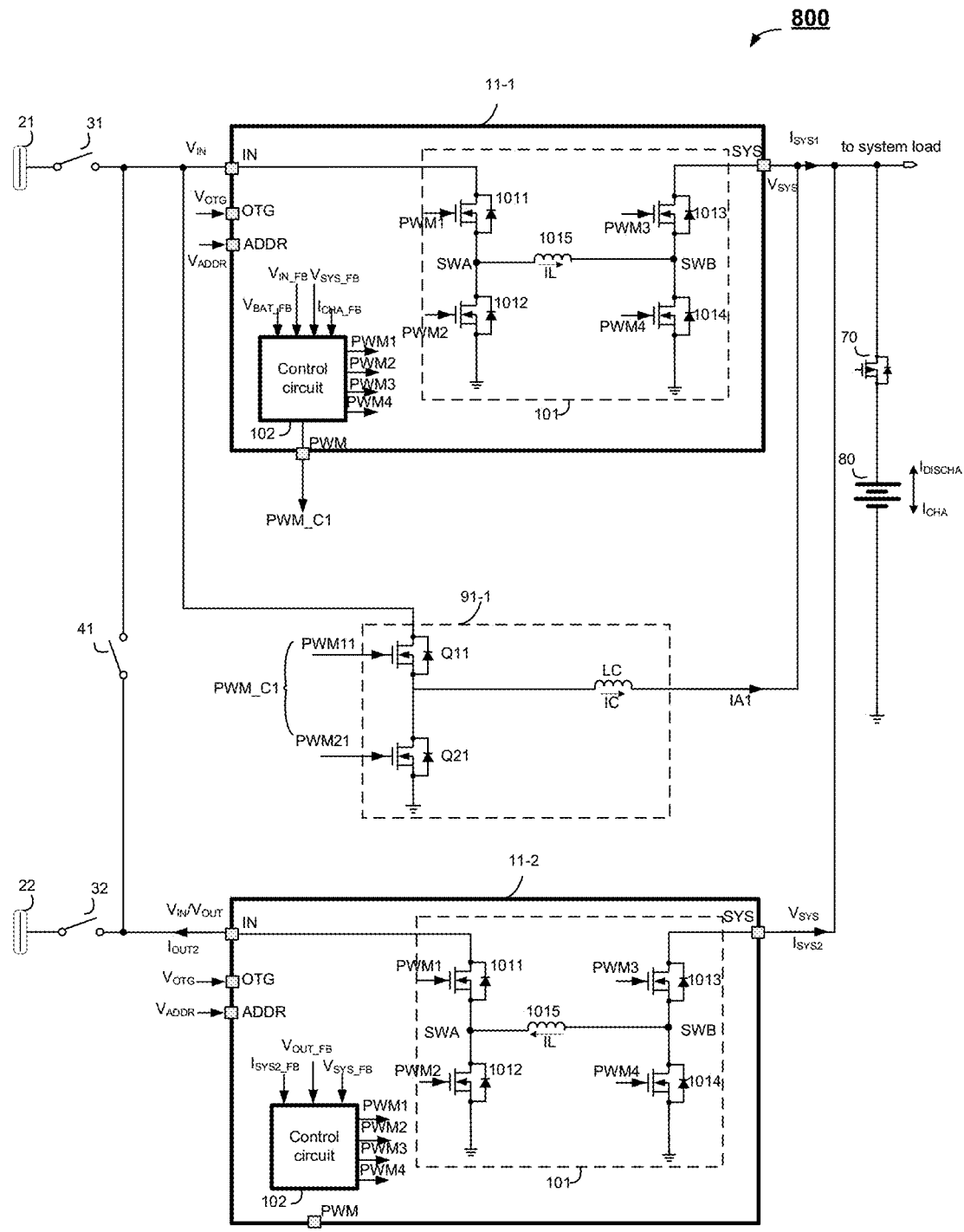
FIG. 8 schematically illustrates a multi-port battery charge and discharge system 800 in accordance with an embodiment of the present invention.

FIG. 8 schematically illustrates a multi-port battery charge and discharge system 800 in accordance with an embodiment of the present invention. The multi-port battery charge and discharge system 800 is a specific embodiment of the multi-port battery charge and discharge system 700, and two voltage converting circuits are chosen as an exemplary embodiment for illustration. The multi-port battery charge and discharge system 800 may further comprise the first switch module 91-1, the USB port 21, the USB port 22, the port connecting switch 31, the port connecting switch 32, the pin connecting switch 41, the battery switch 70 and the battery pack 80 as well as the first voltage converting circuits 11-1 and the second voltage converting circuits 11-2.

In the exemplary embodiment of FIG. 8, the port connecting pin IN of the first voltage converting circuit 11-1 may be coupled to the USB port 21 through the port connecting switch 31. The port connecting pin IN of the second voltage converting circuit 11-2 may be coupled to the USB port 22 through the port connecting switch 32. The port connecting pin IN of the first voltage converting circuit 11-1 and the port connecting pin IN of the second voltage converting circuit 11-2 are coupled together through the pin connecting switch 41. In FIG. 8, the first voltage converting circuit 11-1 is assumed as a master circuit of multi-port battery charge and discharge system 800 so that the first switch module 91-1 is illustrated to be coupled between the port connecting pin IN and the system pin SYS of the voltage converting circuit 11-1. As can be appreciated, the first switch module 91-1 could also be coupled between the port connecting pin IN and the system pin SYS of the voltage converting circuit 11-2 when the second voltage converting circuit 11-2 is assumed as a master circuit.

In an embodiment, the port connecting switch 31, the port connecting switch 32 and the pin connecting switch 41 may be utilized to configure an operating state of the multi-port battery charge and discharge system 800. For instance, if the multi-port battery charge and discharge system 800 is configured to operate in the charge state with a multi-source fast charging way or a multi-port fast charging way, the pin connecting switch 41 is turned off while the port connecting switch 31 and the port connecting switch 32 are turned on; and if the multi-port battery charge and discharge system 800 is configured to operate in the charge state with a parallel charging way, the pin connecting switch 41 and the port connecting switch 31 are turned on while the port connecting switch 32 is turned off. In other embodiment, if the multi-port battery charge and discharge system 800 is configured to operate in the charge and discharge state, the pin connecting switch 41 is turned off while the port connecting switch 31 and the port connecting switch 32 are turned on.

When the multi-port battery charge and discharge system 800 operates in the charge and discharge state, the mode pin OTG of the first voltage converting circuit 11-1 is configured to receive the OTG signal $V_{OTG}$ to determine the first voltage converting circuit 11-1 to operate in the charge mode, and the mode pin OTG of the second voltage converting circuit 11-2 is configured to receive the OTG signal $V_{OTG}$ to determine the second voltage converting circuit 11-2 to operate in the discharge mode. In such an application, the first voltage converting circuit 11-1 is configured to provide a charging current signal (i.e., the master current signal $I_{SYS1}$) at its system pin SYS to charge the battery pack 80 through the battery switch 70, the switch module 91-1 is configured to provide an additional current signal IA1 to charge the battery pack 80 at its output terminal once the switch module 91-1 is enabled, and the second voltage converting circuit 11-2 is configured to provide a discharging current signal $I_{OUT2}$ at its port connecting pin IN to discharge the battery pack 80.

When the multi-port battery charge and discharge system 800 operates in the charge state in which both the first voltage converting circuit 11-1 and the second voltage converting circuit 11-2 are operated in the charge mode. In such an application, the first voltage converting circuit 11-1 is configured to provide a charging current signal (i.e., the master current signal $I_{SYS1}$) at its system pin SYS, the switch module 91-1 is configured to provide the additional current signal IA1 to charge the battery pack 80 at its output terminal once the switch module 91-1 is enabled, and the second voltage converting circuit 11-2 is configured to provide a supplemental charging current signal (i.e., the slave current signal $I_{SYS2}$) at its system pin SYS.

In the exemplary embodiment of FIG. 8, the switching circuits 101 of the first voltage converting circuit 11-1 and the second voltage converting circuit 11-2 are illustrated to have a buck-boost topology comprising the first switch 1011, the second switch 1012, the third switch 1013, the fourth switch 1014 and the inductor 1015. The connection relationships of the first switch 1011, the second switch 1012, the third switch 1013, the fourth switch 1014 and the inductor 1015 are the same as these of embodiment has been described above with reference to FIG. 4, and will not be described here in detail again.

In the exemplary embodiment of FIG. 8, the control circuit 102 of the first voltage converting circuit 11-1 is configured to receive the input voltage feedback signal $V_{IN\_FB}$, the system voltage feedback signal $V_{SYS\_FB}$, the battery voltage feedback signal $V_{BAT\_FB}$ and the battery current feedback signal $I_{CHA\_FB}$, and further configured to generate the switching control signals PWM1-PWM4 based on the input voltage feedback signal $V_{IN\_FB}$, the system voltage feedback signal $V_{SYS\_FB}$, the battery voltage feedback signal $V_{BAT\_FB}$, and the battery current feedback signal $I_{CHA\_FB}$ to respectively control the switches 1011-1014 of the first voltage converting circuit 11-1 on and off so as to generate the master current signal $I_{SYS1}$ and system voltage signal $V_{SYS}$ at its system pin SYS. Besides the switching control signals PWM1-PWM4, the control circuit 102 of the first voltage converting circuit 11-1 is also configured to provide the first switching module control signal PWMC1 at its control pin PWM to control the first switch module 91-1. In the exemplary embodiment of FIG. 8, the first switching module control signal PWMC1 comprises a first charging switch control signal PWM11 and a second charging switch control signal PWM21.

In an embodiment, the first charging switch control signal PWM11 is the same as the switching control signal PWM1, and the second charging switch control signal PWM21 is the same as the switching control signal PWM2. In another embodiment, the first charging switch control signal PWM11 and the switching control signal PWM1 have a phase shift of 180°, and the second charging switch control signal PWM21 and the switching control signal PWM2 have the phase shift of 180°.

In the exemplary embodiment of FIG. 8, when the second voltage converting circuit 11-2 is configured to operate in the discharge mode, the control circuit 102 of the second voltage converting circuit 11-2 is configured to receive the output voltage feedback signal $V_{OUT\_FB}$ and the system voltage feedback signal $V_{SYS\_FB}$ to generate the switching control signals PWM1-PWM4 of the second voltage converting circuit 11-2 based on the output voltage feedback signal $V_{OUT\_FB}$ and the system voltage feedback signal $V_{SYS\_FB}$. In an embodiment, the switching control signals PWM1-PWM4 of the second voltage converting circuit 11-2 is configured to respectively control the switches 1011-1014 of the second voltage converting circuit 11-2 on and off so as to generate a discharge current signals $I_{OUT2}$ and an output voltage signal $V_{OUT}$ at the port connecting pin IN of the second voltage converting circuit 11-2.

In the exemplary embodiment of FIG. 8, when the second voltage converting circuit 11-2 is configured to operate in the charge mode, the control circuit 102 of the second voltage converting circuit 11-2 is configured to receive a supplemental charging current feedback signal $I_{SYS2\_FB}$ to generate the switching control signals PWM1-PWM4 of the second voltage converting circuit 11-2 based on the supplemental charging current feedback signal $I_{SYS2\_FB}$, wherein the supplemental charging current feedback signal $I_{SYS2\_FB}$ may be indicative of the supplemental charging current signal $I_{SYS2}$. In an embodiment, the switching control signals PWM1-PWM4 of the second voltage converting circuit 11-2 is configured to respectively control the switches 1011-1014 of the second voltage converting circuit 11-2 on and off so as to generate the supplemental charging current signal $I_{SYS2}$ and the system voltage signal $V_{SYS}$ at system pin SYS of the second voltage converting circuit 11-2.

In the exemplary embodiment of FIG. 8, the first switch module 91-1 may comprise a first charging switch Q11, a second charging switch Q21 and a charging inductor LC. The first charging switch Q11 and the second charging switch Q21 are coupled in series between the input terminal of the first switch module 91-1 and a reference ground. The charging inductor LC may be coupled between the output terminal of the first switch module 91-1 and a common connection of the first charging switch Q11 and the second charging switch Q21. In an embodiment, inductance of the charging inductor LC is equal to inductance of the inductor 1015. The first charging switch control signal PWM11 is configured to control the first charging switch Q11 on and off; and the second charging switch control signal PWM21 is configured to control the second charging switch Q21 on and off. Noted that the extra switch, such as the first extra switch 90-1 of FIG. 7, is omitted in the embodiment of FIG. 8 since enable of the plurality of switch modules (91-1, . . . , 91-K) is executed by the first charging switch control signal PWM11 and the second charging switch control signal PWM21 rather than controlling the extra switch.

In an embodiment, when the input voltage signal $V_{IN}$ is larger than the system voltage signal $V_{SYS}$, the switching circuit 101 of the voltage converting circuit 11-1 is operated at a step-down mode. The switching control signal PWM3 controls the third switch 1013 on and the switching control signal PWM4 controls the fourth switch 1014 off, while the switching control signals PWM1 and PWM2 control the first switch 1011 and the second switch 1012 to have a complementary on and off state, i.e., the first switch 1011 is on while the second switch 1012 is off, and the first switch 1011 is off while the second switch 1012 is on. In such an application, the first charging switch control signal PWM11 and the second charging switch control signal PWM21 are configured to respectively control the first charging switch Q11 and second charging switch Q21 on and off so as to generated the additional current signal IA1 to charge the battery pack 80. When the input voltage signal $V_{IN}$ is smaller than the system voltage signal $V_{SYS}$, the switching circuit 101 of the voltage converting circuit 11-1 is operated at a step-up mode while the switch module 91-1 is disabled.

Figure 9:
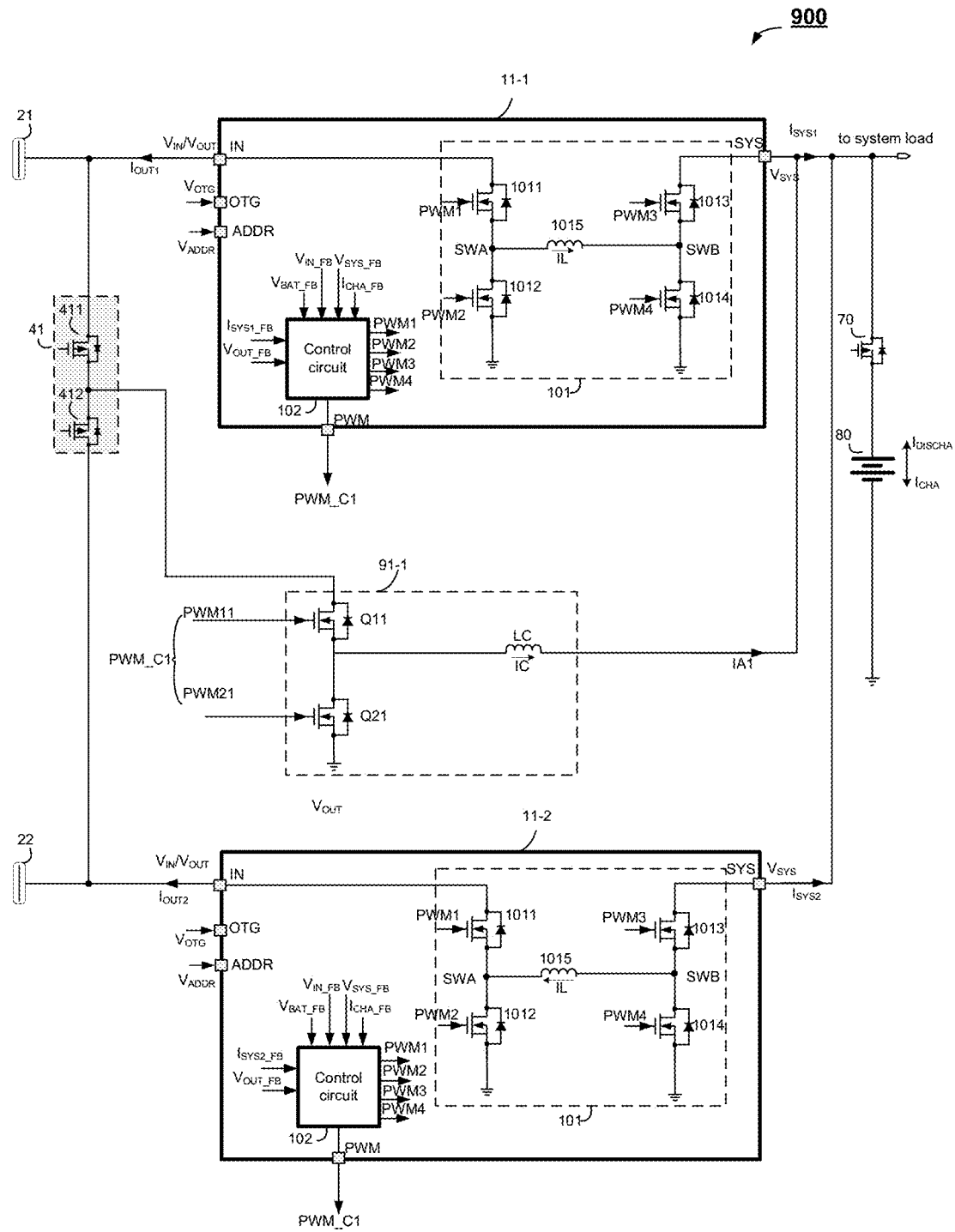
FIG. 9 schematically illustrates a multi-port battery charge and discharge system 900 in accordance with an embodiment of the present invention.

FIG. 9 schematically illustrates a multi-port battery charge and discharge system 900 in accordance with an embodiment of the present invention. The multi-port battery charge and discharge system 900 is a specific embodiment of the multi-port battery charge and discharge system 800. In FIG. 9, if the multi-port battery charge and discharge system 900 is predetermined to operate in the charge and discharge state by customers, i.e., one of the voltage converting circuits 11-1 and 11-2 operates in charge mode and the remained one operates in discharge mode, the port connecting switch 31 and the port connecting switch 32 could be omitted. Meanwhile, the pin connecting switch 41 may be illustrated as a back to back MOSFET having a bi-directional blocking function to configure which port connecting pin IN the input terminal of the switch modules 91-1 is coupled to. In the exemplary embodiment of FIG. 9, the pin connecting switch 41 comprises two MOSFETs 411 and 412 whose sources are connected together. For example, if the voltage converting circuit 11-1 is configured to operate in the charge mode to provide the charging current signal $I_{SYS1}$ at its system pin SYS while the voltage converting circuit 11-2 is configured to operate in the discharge mode to provide the discharging current signal $I_{OUT2}$ at its port connecting pin IN, the MOSFET 411 is turned on and the MOSFET 412 is turned off. On the contrary, if the voltage converting circuit 11-1 is configured to operate in the discharge mode to provide the discharging current signal $I_{OUT1}$ at its port connecting pin IN while the voltage converting circuit 11-2 is configured to operate in the charge mode to provide the charging current signal $I_{SYS2}$ at its system pin SYS, the MOSFET 411 is turned off and the MOSFET 412 is turned on.

Figure 10:
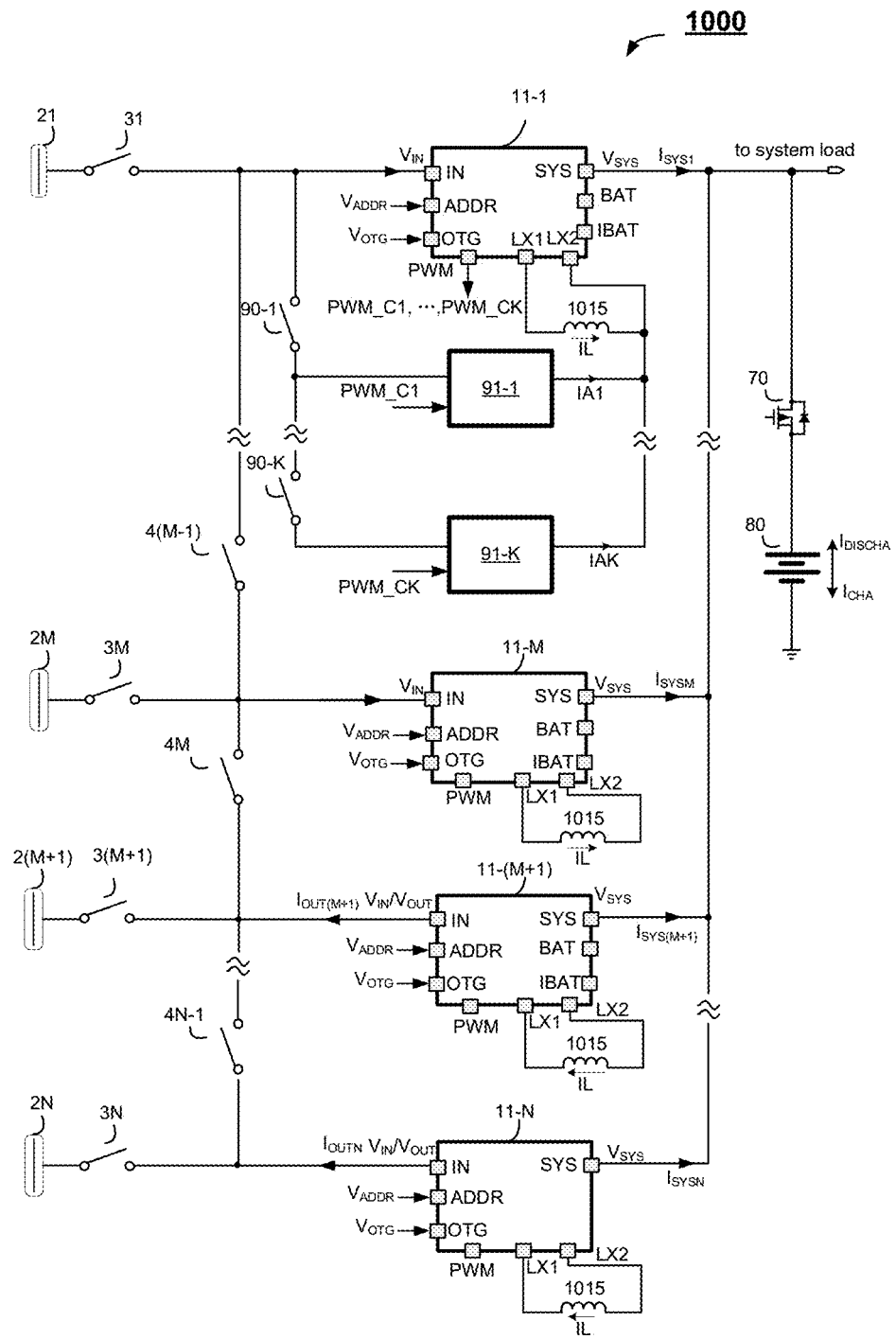
FIG. 10 schematically illustrates a multi-port battery charge and discharge system 1000 in accordance with an embodiment of the present invention.

FIG. 10 schematically illustrates a multi-port battery charge and discharge system 1000 in accordance with an embodiment of the present invention. For each i=1, . . . , N, comparing with the voltage converting circuit 11-i of the multi-port battery charge and discharge system 700 illustrated in FIG. 7, the voltage converting circuit 11-i of the multi-port battery charge and discharge system 1000 may further comprise a first inductor pin LX1 and a second inductor pin LX2. In multi-port battery charge and discharge system 700, for each i=1, . . . , N, the inductor 1015 of the voltage converting circuit 11-i is integrated in its interior. In the multi-port battery charge and discharge system 1000, for each i=1, . . . , N, the inductor 1015 of the voltage converting circuit 11-i is arranged to be connected external of the voltage converting circuit 11-i between the first inductor pin LX1 and the second inductor pin LX2. In the exemplary embodiment of FIG. 10, the output terminals of each of the plurality of extra switches (90-1, . . . , 90-K) are illustrated to be connected together to the second inductor pin LX2 of the master circuit (e.g., the voltage converting circuit 11-1) which generates the master current signal. Alternatively, in other embodiments, the output terminals of each of the plurality of extra switches (90-1, . . . , 90-K) could also be illustrated to be connected together to the system pins SYS of the N voltage converting circuits (11-1, 11-2, . . . , 11-N).

Besides, similarly with foregoing descriptions of the exemplary embodiment of FIG. 7, for each j=1, . . . , K, enable of the switch module 91-j of FIG. 10 may also be determined by either the corresponding extra switch 90-j or the corresponding switching module control signal PWMCj.

Figure 11:
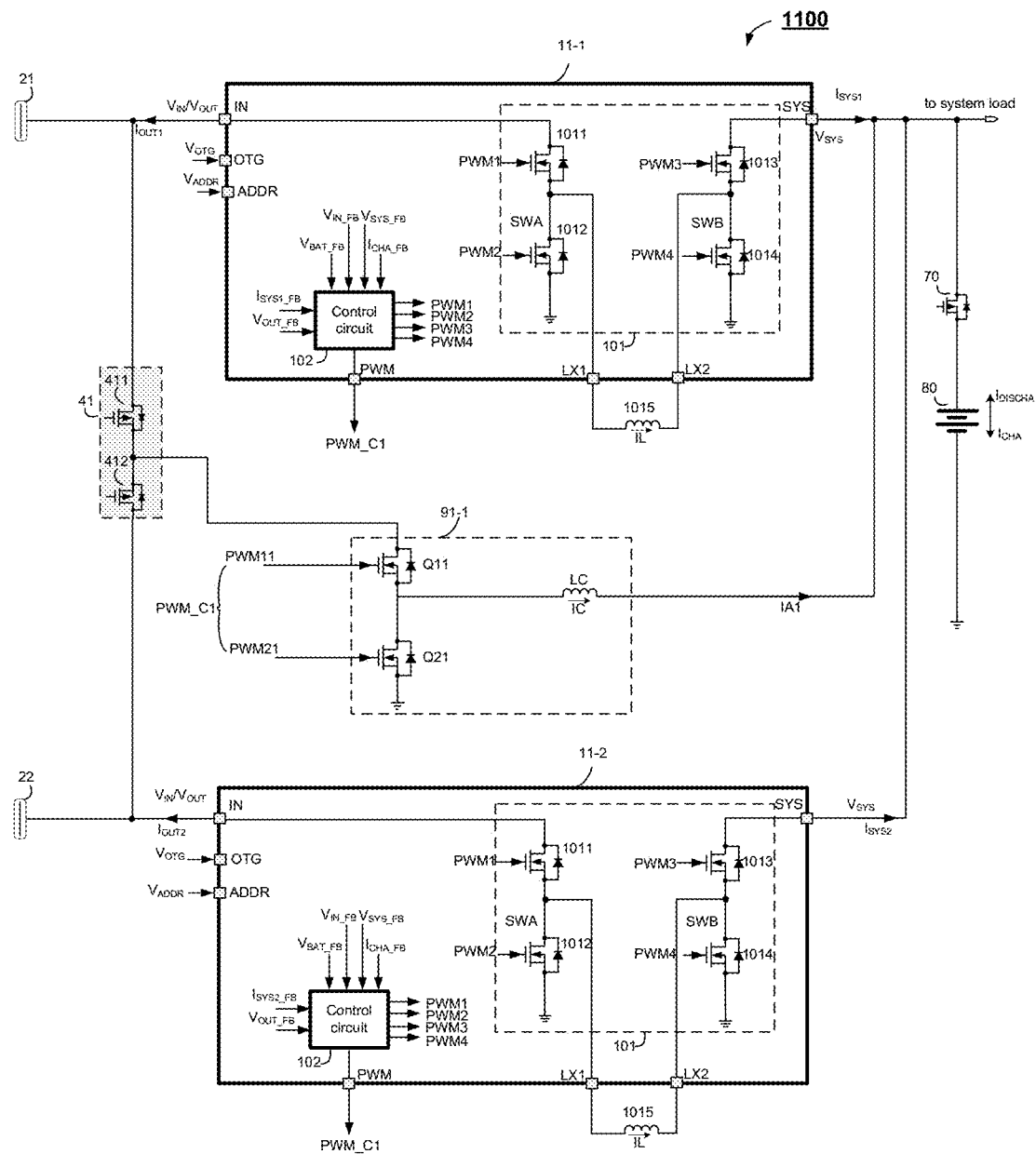
FIG. 11 schematically illustrates a multi-port battery charge and discharge system 1100 in accordance with an embodiment of the present invention.

FIG. 11 schematically illustrates a multi-port battery charge and discharge system 1100 in accordance with an embodiment of the present invention. The multi-port battery charge and discharge system 1100 is a specific embodiment of the multi-port battery charge and discharge system 1000 in which two voltage converting circuits, i.e., the first voltage converting circuits 11-1 and a second voltage converting circuits 11-2, are chosen as an exemplary embodiment for illustration. Comparing with the multi-port battery charge and discharge system 900 illustrated in FIG. 9, both the first voltage converting circuit 11-1 and the second voltage converting circuit 11-2 of the multi-port battery charge and discharge system 1100 may further comprise the first inductor pin LX1 and the second inductor pin LX2. The inductor 1015 of the voltage converting circuit 11-1 is arranged to be connected between the first inductor pin LX1 and the second inductor pin LX2 of the first voltage converting circuit 11-1. The inductor 1015 of the second voltage converting circuit 11-2 is arranged to be connected between the first inductor pin LX1 and the second inductor pin LX2 of the second voltage converting circuit 11-2. In the exemplary embodiment of FIG. 11, the output terminal of the first extra switches 90-1 is illustrated to be connected to the system pins SYS. Alternatively, in other embodiments, the output terminal of the extra switch 90-1 could also be illustrated to be connected to the second inductor pin LX2 of the master circuit. As can be appreciated, the voltage converting circuit operating in the charge mode of the exemplary embodiment of FIG. 11 can be regarded as the master circuit.

Obviously many modifications and variations of the present invention are possible in light of the above teachings. It is therefore to be understood that within the scope of the appended claims the invention may be practiced otherwise than as specifically described. It should be understood, of course, the foregoing invention relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

We claim:

1. A multi-port battery charge and discharge system, comprising:
a plurality of voltage converting circuits, wherein each one of the plurality of voltage converting circuits comprises a first pin configured to receive an input voltage signal, and a second pin configured to provide a system voltage signal, and wherein one of the plurality of voltage converting circuits is configured to be as a master circuit, and wherein the master circuit is configured to operate in a charge mode to generate a master current signal at its second pin; and
a first switch module, wherein an input terminal of the first switch module is coupled to the first pin of the master circuit, and wherein an output terminal of the first switch module is coupled to the second pin of the master circuit, the first switch module is controlled to be enabled or disabled; and wherein
when the input voltage signal is larger than the system voltage signal, the first switch module is enabled and the master circuit is configured to control the first switch module to generate a first additional current signal at the output terminal of the first switch module.

2. The multi-port battery charge and discharge system of claim 1, wherein the master current signal has an average value in each one switching period of the multi-port battery charge and discharge system, and wherein the first additional current signal has an average value in each one switching period of the multi-port battery charge and discharge system, and wherein the average value of the master current signal is a multiple of the average value of the first additional current signal.

3. The multi-port battery charge and discharge system of claim 1, wherein the master current signal has an average value in each one switching period of the multi-port battery charge and discharge system, and wherein the first additional current signal has an average value in each one switching period of the multi-port battery charge and discharge system, and wherein the average value of the master current signal is equal to the average value of the first additional current signal.

4. The multi-port battery charge and discharge system of claim 1, wherein the multi-port battery charge and discharge system further comprises a second switch module, and wherein an input terminal of the second switch module is coupled to the first pin of the master circuit, and an output terminal of the second switch module is coupled to the second pin of the master circuit, and wherein when the input voltage signal is larger than the system voltage signal, the master circuit is configured to control the second switch module to generate a second additional current signal at the output terminal of the second switch module.

5. The multi-port battery charge and discharge system of claim 4, wherein the second additional current signal has an average value in each one switching period of the multi-port battery charge and discharge system, and wherein the first additional current signal has an average value in each one switching period of the multi-port battery charge and discharge system, and wherein the average value of the second additional current signal is equal to the average value of the first additional current signal.

6. The multi-port battery charge and discharge system of claim 1, wherein each of the plurality of voltage converting circuits comprises:
a first switch;
a second switch, wherein the first switch and the second switch are coupled in series between the first pin of a corresponding one of the plurality of voltage converting circuits and a reference ground;
a third switch;
a fourth switch, wherein the third switch and the fourth switch are coupled in series between the second pin of a corresponding one of the plurality of voltage converting circuits and the reference ground; and
an inductor, coupled between a first common connection of the first switch and the second switch and a second common connection of the third switch and the fourth switch.

7. The multi-port battery charge and discharge system of claim 6, wherein the first switch module comprises:
a first charging switch;
a second charging switch, wherein the first charging switch and the second charging switch are coupled in series between the input terminal of the first switch module and a reference ground; and
a charging inductor, coupled between the output terminal of the first switch module and a third common connection of the first charging switch and the second charging switch.

8. The multi-port battery charge and discharge system of claim 7, wherein the first charging switch is configured to turn on and off synchronously with the first switch of the master circuit, and the second charging switch is configured to turn on and off synchronously with the second switch of the master circuit.

9. The multi-port battery charge and discharge system of claim 7, wherein the first charging switch and the first switch of the master circuit are interleaved to turn on and off, and wherein the second charging switch and the second switch of the master circuit are interleaved to turn on and off.

10. The multi-port battery charge and discharge system of claim 1, wherein the master circuit is configured to regulate the master current signal based on a voltage feedback signal indicative of a voltage across a battery pack and a current feedback signal indicative of a current flowing through the battery pack.

11. The multi-port battery charge and discharge system of claim 1, wherein at least two of the plurality of voltage converting circuits are configured to operate in the charge mode, and wherein besides the master circuit, each one of the remained ones of the at least two of the plurality of voltage converting circuits is configured to generate a corresponding predetermined supplemental current signal at its second pin.

12. The multi-port battery charge and discharge system of claim 1, wherein at least one of the plurality of voltage converting circuits is configured to operate in a discharge mode to convert the system voltage signal to a corresponding one output voltage signal at its first pin.

13. The multi-port battery charge and discharge system of claim 1, wherein each one of the plurality of voltage converting circuits further comprises a third pin connected to a microprocessor.

14. The multi-port battery charge and discharge system of claim 7, wherein each one of the plurality of voltage converting circuits further comprises a fourth pin, and wherein the master circuit is configured to provide a charging switch control signal at its fourth pin, and wherein the charging switch control signal is configured to control the first switch module whether to enable or disable, and wherein when the first switch module is enabled, the charging switch control signal is configured to control the first charging switch and the second charging switch on and off.

15. The multi-port battery charge and discharge system of claim 1, wherein the multi-port battery charge and discharge system further comprises a first extra switch, and wherein the input terminal of the first switch module is coupled to the first pin of the master circuit through the first extra switch, and wherein the first extra switch is configured to control the first switch module whether to enable or disable.

16. The multi-port battery charge and discharge system of claim 6, wherein each one of the plurality of voltage converting circuits further comprises a fifth pin and a sixth pin, and wherein the inductor is coupled between the fifth pin and the sixth pin, and wherein the output terminal of first switch module is coupled to the sixth pin rather than the second pin of the master circuit.

17. A multi-port battery charge and discharge system, comprising:
 a first voltage converting circuit, having a first pin configured to receive an input voltage signal, and a second pin, and wherein the first voltage converting circuit is configured to operate in a charge mode to generate a master current signal and a system voltage signal at its second pin;
 a second voltage converting circuit, having a first pin configured to receive the input voltage signal, and a second pin coupled to the second pin of the first voltage converting circuit;
 a first switch module, wherein an input terminal of the first switch module is coupled to the first pin of the first voltage converting circuit, and an output terminal of the first switch module is coupled to the second pin of the first voltage converting circuit, the first switch module is controlled to be enabled or disabled; and wherein
 when the input voltage signal is larger than the system voltage signal, the first switch module is enabled and the first voltage converting circuit is configured to control the first switch module to generate a first additional current signal at the output terminal of the first switch module.

18. The multi-port battery charge and discharge system of claim 17, wherein the second voltage converting circuit is configured to operate in the charge mode to generate a predetermined supplemental current signal at its second pin.

19. The multi-port battery charge and discharge system of claim 17, wherein the second voltage converting circuit is configured to operate in a discharge mode to convert the system voltage signal to an output voltage signal at its first pin.

20. The multi-port battery charge and discharge system of claim 17, wherein the multi-port battery charge and discharge system further comprises a second switch module, and wherein an input terminal of the second switch module is coupled to the first pin of the first voltage converting circuit, and an output terminal of the second switch module is coupled to the second pin of the first voltage converting circuit, and wherein when the input voltage signal is larger than the system voltage signal, the first voltage converting circuit is configured to control the second switch module to generate a second additional current signal at the output terminal of the second switch module.

\* \* \* \* \*